(12) United States Patent  
Park

(10) Patent No.: US 6,975,544 B2  
(45) Date of Patent: Dec. 13, 2005

(54) VOLTAGE DISCHARGE TECHNIQUE FOR CONTROLLING THRESHOLD-VOLTAGE CHARACTERISTICS OF FLOATING-GATE TRANSISTOR IN CIRCUITRY SUCH AS FLASH EPROM

(75) Inventor: Jongmin Park, Fremont, CA (US)

(73) Assignee: ProMOS Technologites, Inc., Hsinchu (TW)

( * ) Notice: Subject to any disclaimer, the term of this patent is extended or adjusted under 35 U.S.C. 154(b) by 0 days.

(21) Appl. No.: 10/780,030

(22) Filed: Feb. 17, 2004

(65) Prior Publication Data

US 2005/0180218 A1    Aug. 18, 2005

(51) Int. Cl.⁷ .............................................. G11C 16/06
(52) U.S. Cl. .......................... 365/185.25; 365/185.28; 365/185.29
(58) Field of Search ...................... 365/185.25, 185.28, 365/185.29, 185.01, 177

(56) References Cited

U.S. PATENT DOCUMENTS

| | | | | |
|---|---|---|---|---|
| 5,999,456 A | * | 12/1999 | Sali et al. ............... | 365/185.28 |
| 6,040,216 A | | 3/2000 | Sung ......................... | 438/257 |
| 6,194,269 B1 | | 2/2001 | Sung et al. ................. | 438/258 |
| 6,355,524 B1 | | 3/2002 | Tuan et al. ................. | 438/257 |
| 6,584,018 B2 | | 6/2003 | Tuan et al. ............. | 365/128.28 |
| 6,654,291 B2 | | 11/2003 | Jan et al. ................ | 365/185.29 |

OTHER PUBLICATIONS

U.S. Appl. No. 10/640,929, filed Aug. 2003, Kim.  
Nation et al., "Architectural Impacts on Flash Endurance and Flash Data Retention", AMD Flash Technology White Paper, Rev. 37, Advanced Micro Drives, Nov. 7, 1999, pp. 1-17.

* cited by examiner

Primary Examiner—David Lam  
(74) Attorney, Agent, or Firm—Ronald J. Meetin

(57) ABSTRACT

An operation, typically an erasure operation, is performed on a floating-gate FET (20) whose components include a body region (BR) and a control-gate electrode (CG) above a floating-gate electrode (FG). A first body voltage ($V_{BE}$) at a body node ($N_B$) is converted into a second body voltage ($V_{BL}$) applied to the body region. A first control voltage ($V_{CE}$) at a control node ($N_C$) is converted into a second control voltage ($V_{CL}$) applied to the control-gate electrode. The two first voltages are placed at respective conditioning values such that the two second voltages cause the FET to be in a specified condition, typically an erased condition. The two first voltages are subsequently discharged with the body and control nodes electrically connected to each other at least as the discharging begins. The two first voltages thereby begin discharging largely simultaneously. This avoids FET damage.

64 Claims, 8 Drawing Sheets

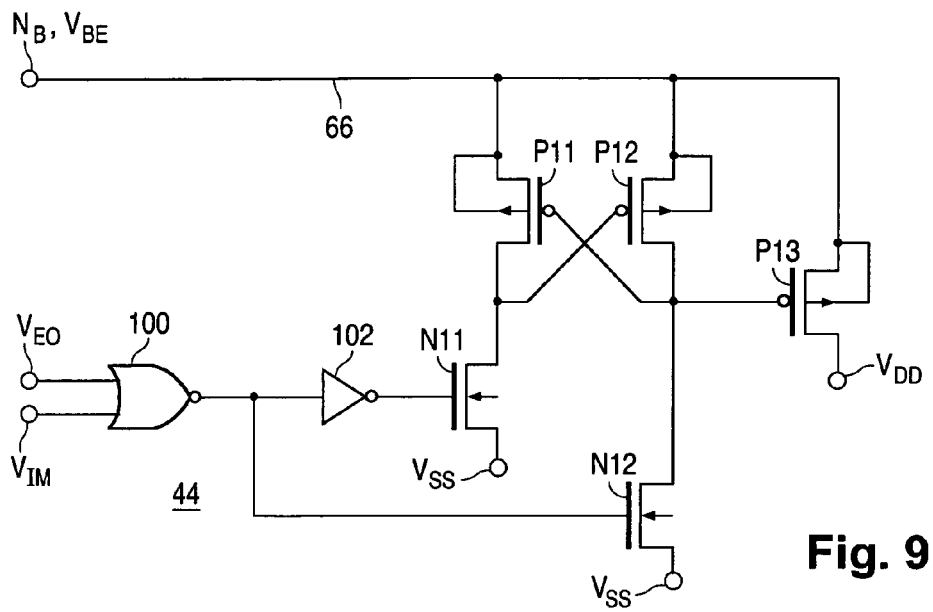
Fig. 9
Fig. 10
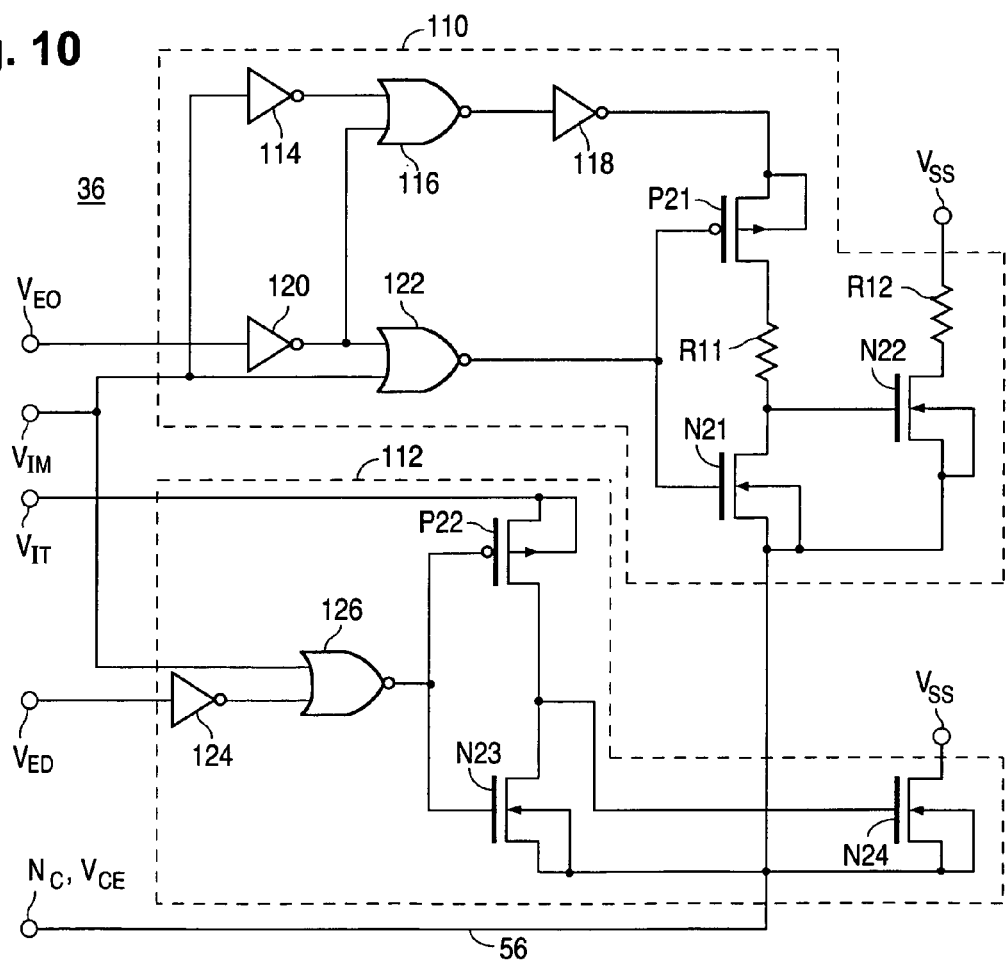

VOLTAGE DISCHARGE TECHNIQUE FOR CONTROLLING THRESHOLD-VOLTAGE CHARACTERISTICS OF FLOATING-GATE TRANSISTOR IN CIRCUITRY SUCH AS FLASH EPROM

FIELD OF USE

This invention relates to floating-gate field-effect transistors ("FETs") utilized in electronic circuitry such as electrically erasable programmable read-only memories ("EPROMs") of the flash-erasable type.

BACKGROUND ART

A floating-gate FET is a basic semiconductor device in which a floating-gate electrode (often simply "floating gate") overlies a channel region that extends between a pair of source/drain regions. A control-gate electrode (often simply "control gate") overlies the floating gate. In some floating-gate FETs such as the split-gate device described in U.S. Pat. No. 6,355,524 B1, another electrode commonly referred to as the select-gate electrode (often simply "select gate") is situated to side of the floating and control gates above the channel region.

A floating-gate FET has a threshold voltage, referred to here as the programmable threshold voltage, which can be adjusted subsequent to FET manufacture for controlling the FET's operational characteristics. During FET operation, one of the source/drain regions functions as the source while the other functions as the drain. A control voltage is applied between the control gate and the source. With suitable potentials applied to other parts of the FET, the programmable threshold voltage is the value of the control voltage at which the FET switches between on and off conditions.

Floating-gate FETs are commonly employed as memory elements in EPROMs. The storage of information in a floating-gate memory FET is controlled by variously placing charge carriers on, and removing charge carriers from, the floating gate to adjust the FET's programmable threshold voltage. These two actions are generally referred to as "programming" and "erasure". In a flash EPROM, all of the memory elements in a substantial portion of the EPROM are erased simultaneously.

Erasure in a flash EPROM formed with n-channel floating-gate FET memory elements is commonly performed by placing the body region of each memory FET at a suitable voltage relative to the FET's control gate. Electrons then tunnel from the floating gate through underlying insulating material to the channel region or/and the source. More particularly, erasure commonly entails (a) first raising the voltage applied to the body region to a suitably high value while the voltage applied to the control gate is reduced to a suitably low value to implement the erasure and (b) subsequently discharging these two voltages to an intermediate value or values. Erasure must be performed carefully to avoid damaging the EPROM.

GENERAL DISCLOSURE OF THE INVENTION

The present invention furnishes a technique for controlling the threshold-voltage characteristics of a floating-gate FET that typically serves as a memory element in an electronic circuit such as a flash EPROM. The floating-gate FET has a pair of source/drain regions separated from each other by a channel portion of a body region that forms a pn junction with each source/drain region. A floating-gate electrode overlies the channel portion. A control-gate electrode overlies the floating gate above the channel portion.

The floating-gate FET is in a first condition, e.g., an erased condition, when its programmable threshold voltage is (a) less than a first transition value $V_{T1}$ if the FET is of n-channel type and (b) greater than $-V_{T1}$ if the FET is of p-channel type. The FET is in a second condition, e.g., a programmed condition, when its programmable threshold voltage is (a) greater than a second transition value $V_{T2}$ if the FET is of n-channel type and (b) less than $-V_{T2}$ if the FET is of p-channel type where $V_{T2}$ exceeds or equals $V_{T1}$. A first body voltage at a body node is converted into a second body voltage applied to the body region. A first control voltage at a control node is converted into a second control voltage applied to the control gate.

The control technique of the invention entails initially placing the first body and first control voltages at respective body and control conditioning values different from each other such that the second body and second control voltages cause the floating-gate FET to be in the first condition with its programmable threshold voltage (a) less than $V_{T1}$ if the FET is of n-channel type or (b) greater than $-V_{T1}$ if the FET is of p-channel type regardless of the immediately previous condition of the FET, i.e., regardless of whether the FET was in the first or second condition immediately previous to the voltage-placing operation. Suitable conditioning circuitry is utilized to perform the voltage-placing operation.

The first body and first control voltages are subsequently discharged respectively to discharge values between the conditioning values. The voltage discharge operation is performed with voltage discharge circuitry. Importantly, the body and control nodes are electrically connected to each other at least at the start of the voltage discharge operation. This enables the first body and first control voltages to begin discharging largely simultaneously towards their respective discharge values.

The two first voltages, i.e., the first body voltage and the first control voltage, discharge in opposite (rising/falling) directions. If the body and control nodes were not electrically connected to each other at the beginning of the discharge operation, one of the two first voltages could start to discharge before the other. Due to capacitive coupling, the first voltage that begins to discharge last might initially attempt to track the first voltage that begins to discharge first. Since the two first voltages discharge in opposite directions, the first voltage that begins to discharge last might initially move in the direction opposite to the direction in which that first voltage must move to discharge. This initial opposite-direction voltage movement could damage the floating-gate FET or/and impair its operation.

The electrical interconnection of the body and control nodes at the beginning of the discharge operation in accordance with the invention causes the first body and first control voltages to begin discharging largely simultaneously and thereby prevents one of them from starting to discharge before the other. Consequently, the electrically interconnection of the body and control nodes at the beginning of the discharge operation avoids damage that could otherwise occur due to temporary voltage tracking if one of the two first voltages were to start discharging before the other.

After the discharge operation has started and thus after the first body and first control voltages have begun to discharge largely simultaneously, the body node is typically electrically connected to a source of a body reference voltage equal to the body discharge value. Subsequent to starting the discharge operation, the control node is likewise typically electrically connected to a source of a control reference voltage equal to the control discharge value. Providing these two electrical connections facilitates discharging the two first voltages.

When the floating-gate FET is a memory element in a flash EPROM, the first body voltage is converted into a second body voltage applied to the body regions of a group of such floating-gate FETs. The control voltage is converted into a plurality of second control voltages, each of which is applied to the control gate of at least one of the FETs. The second body and second control voltages thereby cause all of the FETs to be placed simultaneously in the first condition with their threshold voltages (a) less than $V_{T1}$ if the FETs are of n-channel type or (b) greater than $-V_{T1}$ if the FETs are of p-channel type. Accordingly, the first condition is an erasure condition for the flash EPROM. The voltage-placing operation is the actual erasure portion of the simultaneous (flash) erasure while the voltage-discharging operation is the discharging portion of the flash erasure. The second condition is the programmed condition for the flash EPROM.

In short, discharging of voltages that control the threshold-voltage characteristics of a floating-gate FET is performed in a highly advantageous manner according to the teachings of the invention. The electrical interconnection of the body and control nodes at the beginning of the discharge operation avoids undesired voltage movement and consequent damage. The invention thereby provides a significant advance over the prior art.

BRIEF DESCRIPTION OF THE DRAWINGS

FIGS. 6a and 6b are circuit diagrams of a pair of floating-gate FETs alternatively employable as memory cells in an EPROM configured according to the invention.

FIGS. 8–10 are circuit diagrams of respective embodiments of the common discharge circuitry, the body-line discharge circuitry, and the control-line discharge circuitry in the EPROM of FIG. 1.

Like reference symbols are employed in the drawings and in the description of the preferred embodiments to represent the same, or very similar, item or items.

DESCRIPTION OF THE PREFERRED EMBODIMENTS

In the following description, the term "connected" generally means physically connected except where indicated to mean electrically connected in order to permit passage of an electrical signal. The term "line" means an electrical line or conductor. All single-gate field-effect transistors (again, "FETs") described below are enhancement-mode insulated-gate FETs where "enhancement-mode" is defined for the condition in which the body region of the FET is electrically shorted to its source.

A flash EPROM typically contains a plurality of sections, referred to here as sectors, each containing an array of memory cells that are erased simultaneously and can be erased separately, and thus at different times, than the memory cells in each other such EPROM sector. As used in describing a line that carries a signal for such a simultaneously erasable EPROM sector, the term "local" means that the signal on the line is local to that EPROM sector and is not provided to any other simultaneously erasable EPROM sector. The term "global" as used in describing a line that carries a signal for a simultaneously erasable EPROM sector means that the line provides the signal to at least one other such sector. A "global" line can be global to the entire EPROM or to a group, often called a mat, of the EPROM sectors.

Figure 1:
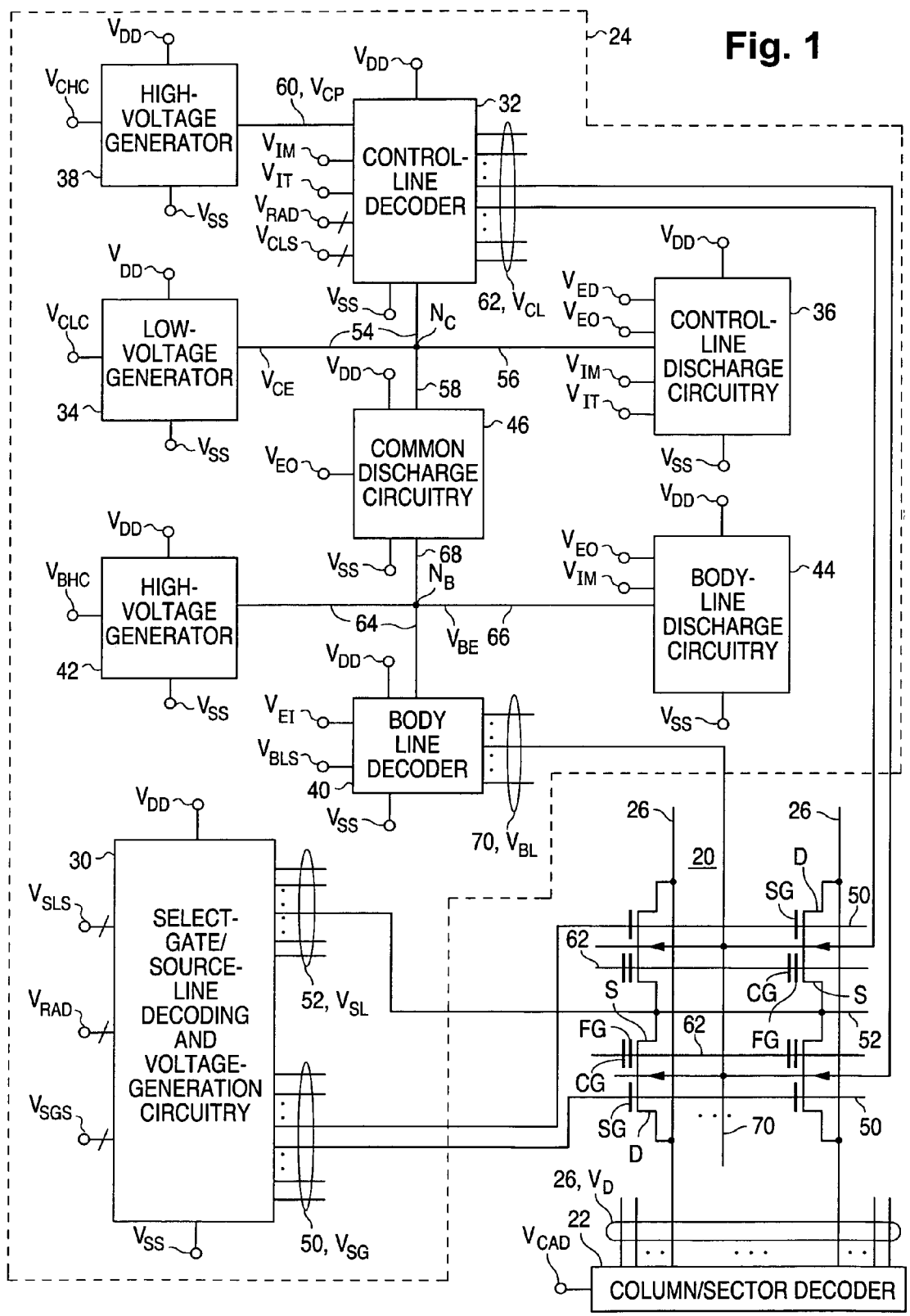
FIG. 1 is a block/circuit diagram of part of a flash EPROM configured in accordance with the invention.

FIG. 1 illustrates part of a flash EPROM configured in accordance with the invention to substantially alleviate undesired opposite-direction voltage movement during the discharge portions of erasure operations. The core of the EPROM circuitry in FIG. 1 is a multiplicity of largely identical memory cells 20 arranged in rows and columns. Four memory cells 20 are depicted in FIG. 1. Cells 20 respectively store bits of data where each bit is either a high logic "1" or a low logic "0".

Figure 11:
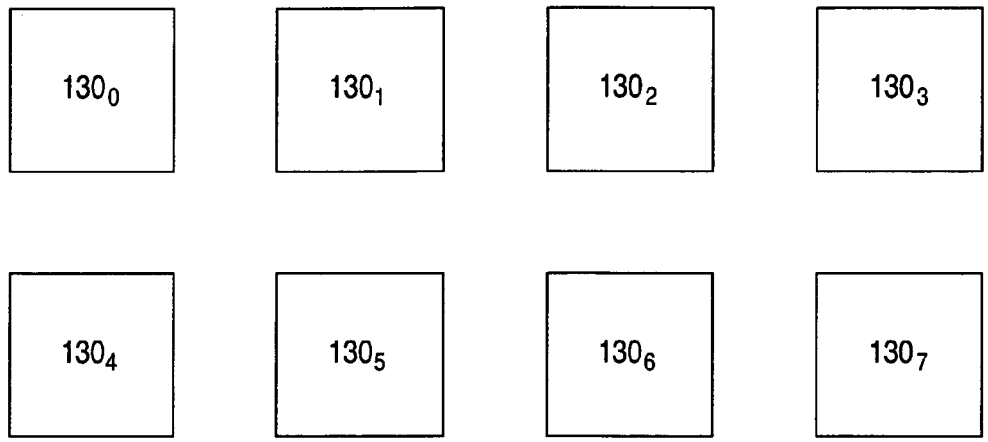
FIG. 11 is a block diagram of a group of mats in an embodiment of the EPROM of FIG. 1.
Figure 12:
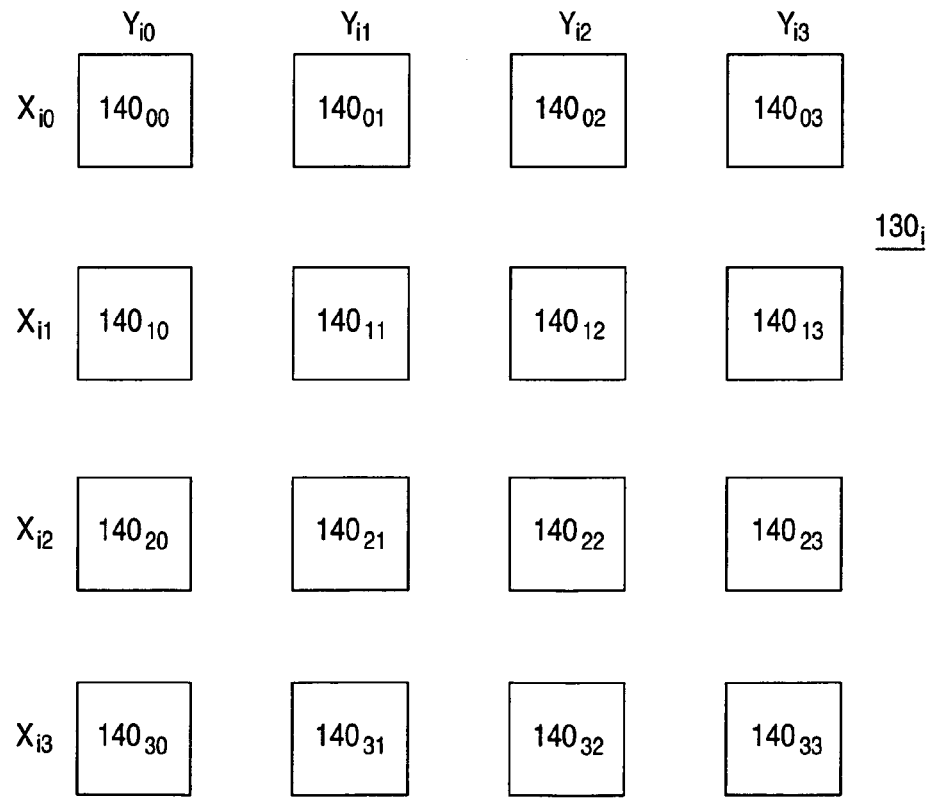
FIG. 12 is a block diagram of a group of EPROM sectors in the mat of FIG. 11.

All of cells 20 in FIG. 1 are simultaneously erasable to logic "1". Cells 20 in FIG. 1, along with the associated local lines and circuitry, thereby form one of the above-mentioned simultaneously erasable EPROM sectors. FIGS. 11 and 12, described below, illustrate how the EPROM is divided into a set of mats where each mat contains an array of the EPROM sectors.

Each memory cell 20 is implemented with a memory element consisting of an n-channel floating-gate FET whose programmable threshold voltage is varied during display operation for storing a logic "1" or a logic "0". As further shown in FIGS. 2 and 3, each floating-gate memory FET 20 has a pair of heavily doped n-type source/drain regions S and D laterally separated from each other by a channel portion of a p-type body region BR of the semiconductor body. Body region BR forms a pn junction with each of source/drain regions S and D. Except during programming operations, regions S and D normally respectively function as source and drain and, for convenience, are hereafter respectively referred to as source S and drain D.

A floating-gate electrode (again, often simply "floating gate") FG overlies the channel portion of body region BR and is separated from the semiconductor body, including the channel portion, by a gate dielectric layer GD. A control gate electrode (again, often simply "control gate") CG overlies floating gate FG and is separated from gate FG by an intergate dielectric layer IGD. Dielectric spacers SP are situated along the sidewalls of gates FG and CG. The combination of electrical insulating regions GD, IGD, and SP fully surrounds floating gate FG.

Figure 2:
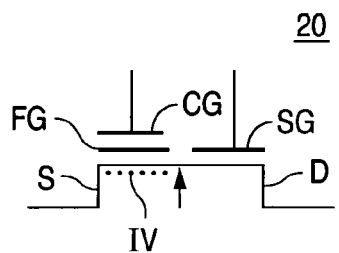
FIG. 2 is a circuit diagram of a floating-gate FET employed in the EPROM of FIG. 1.
Figure 3:
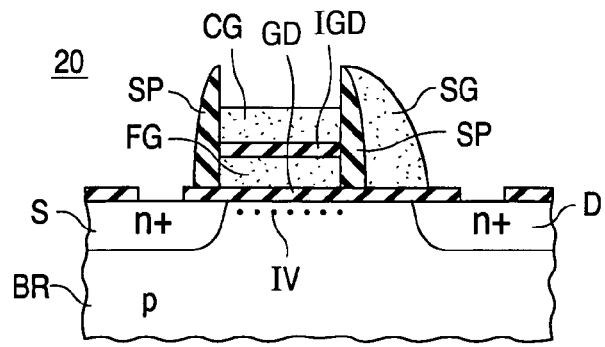
FIG. 3 is a cross-sectional view of an embodiment of the floating-gate FET of FIG. 2.

In the example of FIGS. 1–3, each floating-gate memory FET 20 is a split-gate device having a select-gate electrode (again, often simply "select gate") SG that overlies part of the channel portion to the side of gates FG and CG. Select gate SG is separated from gates FG and CG by one of spacers SP and from the semiconductor body, including the channel portion, by gate dielectric layer GD. Since select gate SG overlies part of the channel portion, gates FG and CG overlie part (another part) of the channel portion. Gate SG extends partially over drain D. Gates FG and CG extend partially over source S.

Floating-gate FETs 20 can be implemented as p-channel devices provided that the polarities of the voltages applied to FETs 20 are largely reversed. In that case, the conductivity types of regions S, D, and BR are also reversed. Each FET 20 is either in a first condition, sometimes referred to as the erased condition, or in a second condition, sometimes referred to as the programmed condition, dependent on the value of that FET's programmable threshold voltage.

A floating-gate FET 20 implemented as an n-channel device is in the first, or erased, condition when its programmable threshold voltage is less than first transition value $V_{T1}$ which can be positive, zero, or negative. An FET 20 implemented as a p-channel device is in the first condition when its programmable threshold voltage is greater than $-V_{T1}$. Analogous to $V_{T1}$, $-V_{T1}$ can be negative, zero, or positive. An FET 20 in the first condition stores a logic "1".

A floating-gate FET 20 implemented as an n-channel device is in the second, or programmed, condition when its programmable threshold voltage is greater than positive second transition value $V_{T2}$. In addition to being greater than zero, second transition value $V_{T2}$ is greater than or equal to first transition value $V_{T1}$. An FET 20 implemented as a p-channel device is in the second condition when its programmable threshold voltage is less than $-V_{T2}$. Since $V_{T2}$ is positive and greater than or equal to $V_{T1}$, $-V_{T2}$ is negative and less than (more negative than) or equal to $-V_{T1}$. An FET 20 in the second condition stores a logic "0".

Second threshold transition value $V_{T2}$ is normally greater than first threshold transition value $V_{T1}$ so that the two FET conditions are separated by a finite voltage space. In a typical implementation, value $V_{T2}$ is 4–6 V, typically 5 V, while value $V_{T1}$ is –1–1 V, typically 0 V.

The two FET conditions for each FET 20 are physically demarcated by the presence/absence of a primary inversion layer IV in body region BR along the upper semiconductor surface below floating gate FG when a control voltage is applied at a suitable nominal value between control gate CG and source S. Primary inversion layer IV adjoins source S and is spaced apart from drain D. The control voltage is of such a nature that the potential of control gate CG is greater than the potential of source S when FET 20 is an n-channel device and less than the potential of source S when FET 20 is a p-channel device. When second transition value $V_{T2}$ is greater than first transition value $V_{T1}$, the nominal value of the control voltage typically lies (a) between transition values $V_{T1}$ and $V_{T2}$ when FET 20 is of n-channel type and (b) between $-V_{T2}$ and $-V_{T1}$ when FET 20 is of p-channel type.

Primary inversion layer IV is present when FET 20 is in the first, or erased, condition and stores a logic "1". Inversion layer IV is absent when FET 20 is in the second, or programmed, condition and stores a logic "0". A dotted line is utilized in FIGS. 2 and 3 to indicate the location of layer IV because its presence/absence depends on whether illustrated FET 20 is in the first or second condition.

Floating-gate memory FETs 20 in the EPROM sector of FIG. 1 are operated and controlled generally in the following way. Before performing an operation to write information into FETs 20, an erasure operation is performed simultaneously on all of FETs 20 so that they are all in the first, or erased, condition at logic "1" with their programmable threshold voltages (a) less than $V_{T1}$ if FETs 20 are of n-channel type or (b) greater than $-V_{T1}$ if FETs 20 are of p-channel type. Part, and potentially all, of FETs 20 may be in the erased condition prior to erasure. Each FET 20, if any, that is not in the erased condition immediately before erasure is thus placed in the erased condition substantially simultaneously as each other FET 20, if any, that is likewise not in the erased condition immediately before erasure.

After erasure is completed, information can be written into the EPROM sector of FIG. 1. Writing is accomplished by performing a programming operation on certain selected ones of floating-gate FETs 20 to place those selected FETs 20 in the second, or programmed, condition at logic "0" with their programmable threshold voltages (a) greater than $V_{T2}$ if FETs 20 are of n-channel type or (b) less than $-V_{T2}$ if FETs 20 are of p-channel type. At the end of a typical programming/write (or simply "programming") operation, some of FETs 20 are typically in the programmed condition at logic "0" while others remain in the erased condition at logic "1". A read operation can now be performed to determine the information stored in various ones of FETs 20.

Floating-gate memory FETs 20 are accessed and controlled through a column/sector decoder 22 and a row/sector decoder 24. In addition to decoders 22 and 24, FETs 20, and the memory FETs in the other EPROM sectors, the EPROM of FIG. 1 includes a write buffer, a groups of sense amplifiers, a read buffer, and input/output circuitry (all not shown). Although illustrated memory FETs 20 are employed in only one EPROM sector, decoders 22 and 24 along with the write buffer, sense amplifiers, read buffer, and input/output circuitry service the entire EPROM. The various EPROM components, including decoders 22 and 24, are collectively connected between a source of a high supply voltage $V_{DD}$ and a source of a low supply $V_{SS}$ whose difference defines a supply voltage range $V_{DD}$–$V_{SS}$. High supply voltage $V_{DD}$ is typically 3 V. Low supply voltage $V_{SS}$ is typically 0 V (ground reference).

The configuration and operation of the EPROM components is described below for the illustrated case in which FETs 20 are n-channel devices. The voltage polarities can largely be reversed if FETs 20 are implemented as p-channel devices.

Column/sector decoder 22 is connected to drains D of floating-gate FETs 20 by way of local bit lines 26 that carry bit-line voltage signals $V_D$. Decoder 22 receives column address signals $V_{CAD}$, sector selection signals (not indicated in FIG. 1), and various column control signals (also not indicated in FIG. 1). When the sector selection signals are set at values that select the EPROM sector illustrated in FIG. 1, an erase, programming, or read operation can be performed on FETs 20. For an erase operation, decoder 22 is controlled so as to let bit-line voltages $V_D$ float on all of bit lines 26 for the illustrated sector.

When a programming operation is being performed, column/sector decoder 22 provides data from the write buffer (again, not shown) to selected ones of bit lines 26 in response to column address signals $V_{CAD}$ and the column control signals. Row/sector decoder 24 selects a row of FETs 20 so that information on selected bit lines 26 is programmed into FETs 20 at the intersection of that row and the selected bit lines 26. On each selected bit line 26 connected to an FET 20 being programmed to a logic "0", bit-line voltage $V_D$ is at $V_{SS}$ during the programming operation. Bit-line voltages $V_D$ on all other bit lines 26, both selected and unselected, in the illustrated EPROM sector are at $V_{DD}$ during the programming operation.

For a read operation, row/sector decoder 24 selects a row of FETs 20. Responsive to column address signals $V_{CAD}$ and the column control signals, column/sector decoder 22 provides the information stored in FETs 20 at the intersection of a selected row and selected ones of bit lines 26 to the sense amplifiers (again, not shown). The sense amplifiers determine (detect and amplify) the information read out of the selected FETs 20 and provide that information to the write buffer (again, not shown). Further information on a typical implementation of column/sector decoder 22 is presented in Kim, U.S. patent application Ser. No. 10/640,929, filed 5 Aug. 2003, the contents of which are incorporated by reference herein.

Row/sector decoder 24 contains select-line/source-line decoding and voltage-generation circuitry 30, a control-line decoder 32, a low-voltage generator 34, control-line discharge circuitry 36, a high-voltage generator 38, a body-line decoder 40, a high-voltage generator 42, body-line discharge circuitry 44, and common discharge circuitry 46.

Select-line/source-line decoding and voltage-generation circuitry 30 (referred to, for simplicity, as "select/source decoder 30") receives row address signals $V_{RAD}$, select-line selection (or selection/control) signals $V_{SGS}$, and source-line selection (or selection/control) signals $V_{SLS}$. Programming, erase, read, sector choice, and other control functions are selected by providing select-line selection signals $V_{SGS}$ and source-line selection signals $V_{SLS}$ at suitable values. Row address signals $V_{RAD}$ are normally generated in such a manner that only one row of memory FETs 20 is selected for a programming or read operation at a time.

Responsive to row address signals $V_{RAD}$ and select-line selection signals $V_{SGS}$, select/source decoder 30 provides row-selection voltage signals $V_{SG}$ respectively on global word lines 50 respectively corresponding to the rows of floating-gate FETs 20. Word lines 50 are global to each group of EPROM sectors that form a mat. Some of word lines 50 typically go to EPROM sectors other than the illustrated sector. Each word line 50 for the illustrated sector is connected to select gates SG of FETs 20 in a different cell row. When select-line selection signals $V_{SGS}$ are at values that select the EPROM sector having FETs 20 illustrated in FIG. 1, further setting signals $V_{SGS}$ at values that select erasure causes row-selection voltages $V_{SG}$ on all word lines 50 in the illustrated EPROM sector to be at an intermediate value $V_{ITM}$ between $V_{SS}$ and $V_{DD}$ but closer to $V_{DD}$. Intermediate value $V_{ITM}$ is typically 2 V above $V_{SS}$ and thus typically 1 V below $V_{DD}$.

Setting select-line selection signals $V_{SGS}$ at values that select programming causes row-selection signal $V_{SG}$ on word line 50 for a selected row of FETs 20 to be at intermediate value $V_{ITM}$. Voltages $V_{SGS}$ on all other word lines 50 are at $V_{SS}$. Setting signals $V_{SGS}$ at values that select read causes voltage $V_{SG}$ to be at $V_{DD}$ on word line 50 for a selected row of FETs 20. Voltages $V_{SG}$ are at $V_{SS}$ on all other word lines 50 during the read operation.

Responsive to source-line selection signals $V_{SLS}$ and row address signals $V_{RAD}$, select/source decoder 30 provides local source-line programming voltage signals $V_{SL}$ respectively on local source lines 52. Some of source lines 52 are local to the illustrated EPROM sector whereas others are local to other sectors. Each source line 52 for the illustrated sector is connected to sources S of FETs 20 in one or more, typically four, rows of FETs 20s for providing an associated one of source-line voltages $V_{SL}$ to those sources S. When source-line selection signals $V_{SLS}$ are at values that select the EPROM sector of FIG. 1, further settings signals $V_{SLS}$ at values that select erasure causes the source/line circuitry of decoder 30 to be effectively electrically disconnected from source lines 52 for the illustrated sector. Consequently, source-line voltages $V_{SL}$ on source lines 52 for the illustrated sector float during erasure.

When source-line selection signals $V_{SLS}$ are at values that select programming, select/source decoder 30 provides source-line voltages $V_{SL}$ at a high source programming value $V_{SPH}$ on source line 52 connected to FETs 20 in the selected cell row and typically in three other cell rows. Source programming value $V_{SPH}$ is considerably greater than $V_{DD}$, e.g., typically 3 V above $V_{DD}$ and thus typically 6 V above $V_{SS}$. Voltages $V_{SL}$ on all other source lines 52 in the illustrated EPROM sector are at $V_{SS}$. Decoder 30 contains high-voltage generation circuitry, normally a charge pump, that generates the high $V_{SPH}$ value for source-line signals $V_{SL}$. Placing source-line selection signals $V_{SLS}$ at values that select read causes voltages $V_{SL}$ to be at $V_{SS}$ on all source lines 52 in the illustrated sector.

Control-line decoder 32 receives an erasure control voltage signal $V_{CE}$ on a line 54 connected to low-voltage generator 34 normally implemented with a charge pump. Low-voltage generator 34 adjusts erasure control voltage $V_{CE}$ in response to a generator control signal $V_{CLC}$. Control-line discharge circuitry 36 is connected by way of a line 56 to a control node $N_C$ on line 54. Common discharge circuitry 46 is similarly connected through a line 58 to control node $N_C$. Lines 56 and 58 actually typically connect to line 54 at different places and thus at two different nodes on line 54. However, the two nodes are substantially electrically equivalent and, for convenience, are simply termed here as control node $N_C$ at which voltage $V_{CE}$ is present. As discussed below, voltage $V_{CE}$ varies from an erasure control discharge value, typically $V_{SS}$, to a low erasure control conditioning value $V_{CEL}$ considerably below $V_{SS}$. Erasure control conditioning value $V_{CEL}$ is typically 10 V below $V_{SS}$.

Control-line discharge circuitry 36 typically contains (a) circuitry, referred to as "strong-ground" circuitry, for connecting line 56 to the $V_{SS}$ supply and (b) circuitry, referred to as "weak-ground" circuitry, for further connecting line 56 to the $V_{SS}$ supply. An example of discharge circuitry 36 as implemented with the strong-ground and weak-ground circuitries is described below in connection with FIG. 10.

An erasure operation consists of a main erasure portion and an erasure voltage discharge portion. Control-line discharge circuitry 36 is provided with four signals that variously control the timing of the main erasure and discharge portions of an erasure operation: an erasure/discharge voltage signal $V_{ED}$, an erasure-only voltage signal $V_{EO}$, an erasure-voltage-detection voltage signal $V_{IM}$, and a longer-duration erasure-voltage-detection voltage signal $V_{IT}$. Erasure/discharge voltage $V_{ED}$ establishes the full length, including the discharge portion, of an erasure interval. Erasure-only voltage $V_{EO}$ establishes the length of the main erasure portion of an erasure interval. Erasure-only voltage $V_{EO}$ is also provided to common discharge circuitry 46. Low-voltage generator 34 and discharge circuitries 36 and 46 cooperate as described below to produce erasure control voltage $V_{CE}$. Erasure-voltage-detection voltages $V_{IM}$ and $V_{IT}$ are, as discussed further below, both generated from an additional erasure-voltage-detection voltage signal.

A programming control voltage signal $V_{CP}$ is provided from high-voltage generator 38, normally implemented with a charge pump, to control-line decoder 32 on a line 60. In response to a generator control signal $V_{CHC}$, generator 38 adjusts programming control voltage $V_{CP}$ between $V_{DD}$ and a high programming control value $V_{CPH}$ substantially greater than $V_{DD}$. Programming control value $V_{CPH}$ is typically 7 V above $V_{DD}$ and thus typically 10 V above $V_{SS}$.

Decoder 32 also receives row address signals $V_{RAD}$, control-line selection (or selection/control) signals $V_{CLS}$, and erasure-voltage-detection (generally simply "detection") voltages $V_{IM}$ and $V_{IT}$. Programming, erase, read, sector choice, and other control functions are selected by providing control-line selection signals $V_{CLS}$ at suitable values.

Using programming control voltage $V_{CP}$, high supply voltage $V_{DD}$, low supply voltage $V_{SS}$, and erasure control voltage $V_{CE}$, control-line decoder 32 generates control-line programming/erasure signals $V_{CL}$ respectively on local control lines 62 in response to row address signals $V_{RAD}$, control-line selection signals $V_{CLS}$, and detection voltages $V_{IM}$ and $V_{IT}$. Some of control lines 62 are local to the illustrated EPROM sector while others are local to other EPROM sectors. Each of control lines 62 for the illustrated sector is connected to control gates CGs of FETs 20 in one or more, typically four, rows of FETs 20 for providing an associated one of control-line signals $V_{SL}$ to those control gates CG. Each cell row connected to a particular control line 62 is connected to a different source line 52.

Each control-line voltage $V_{CL}$ is provided from control-line decoder 32 so as to settle at one of the following four values (running from highest to lowest) during EPROM operation: $V_{CPH}$, $V_{DD}$, $V_{SS}$, and $V_{CEL}$, e.g., typically respectively 10, 3, 0, and −10 V. When control-line selection signals $V_{CLS}$ are set at values that select the EPROM sector of FIG. 1, further setting signals $V_{CLS}$ at values that select erasure cause control-line signals $V_{CL}$ to go from $V_{SS}$ downward to low erasure control conditioning value $V_{CEL}$ on all control lines 62 for the illustrated EPROM sector during the main portion of the erasure operation. Control-line voltages $V_{CL}$ on control lines 62 in the illustrated EPROM sector are subsequently returned to $V_{SS}$ during the discharge portion of the erasure operation in the inventive manner described below.

Setting control-line selection signals $V_{CLS}$ at values that select programming causes control-line voltage $V_{CL}$ to be provided at high programming voltage $V_{CPH}$ on control line 62 connected to FETs 20 in the selected cell row and typically in three other cell rows. Control-line voltages $V_{CL}$ are at $V_{SS}$ on all other control lines 62 for the illustrated EPROM sector. With select-line selection signals $V_{SLS}$ to select/source decoder 30 being simultaneously set at values that select programming for the sector of FIG. 1, source-line voltage $V_{SL}$ is provided at high programming value $V_{SPH}$ on source line 52 connected to FETs 20 in the selected cell row and typically to three other cell rows that differ from the additional three cell rows that receive high control-line programming voltage $V_{CPH}$ at the same time as the selected cell row. As determined by bit-line voltages $V_D$ on bit lines 26, certain of FETs 20 in the selected row undergo programming to logic "0". No FET 20 in any of the other rows undergoes programming to logic "0" because none of them receives both of high programming voltages $V_{SPH}$ and $V_{CPH}$ at the same time as the selected row.

Setting control-line selection signals $V_{CLS}$ at values that select read causes control-line voltage $V_{CL}$ to be at $V_{DD}$ on control line 62 for the selected row of floating-gate FETs 20 and, in the preferred embodiment mentioned above, for three other rows of FETs 20. Control-line voltages $V_{CL}$ are normally at $V_{SS}$ on all other control lines 62 for the illustrated EPROM sector during the read operation. Since select-line voltages $V_{SG}$ are provided at $V_{DD}$ on word line 50 for the selected cell row and at $V_{SS}$ on lines 50 for all other cell rows in the illustrated sector, certain of FETs 20 in the selected cell row undergo reading as determined by bit-lines voltages $V_D$ on bit lines 26.

Body-line decoder 40 receives an erasure body voltage signal $V_{BE}$ on a line 64 connected to high-voltage generator 42 normally implemented with a charge pump. High-voltage generator 42 adjusts erasure body voltage $V_{BE}$ in response to generator control signal $V_{BHC}$. Body-line discharge circuitry 44 is connected by way of a line 68 to a body node $N_B$ on line 64. Common discharge circuitry 46 is similarly connected through a line 66 to body node $N_B$. Analogous to what was said above about lines 56 and 58 relative to control node $N_C$, lines 66 and 68 are actually typically connected to line 64 at two different places and therefore at two different nodes on line 64 but, because these two nodes on line 64 are substantially equivalent electrically, they are treated here as body node $N_B$ at which voltage $V_{BE}$ is present. As discussed below, voltage $V_{BE}$ varies from an erasure body discharge value, typically $V_{DD}$, to a high erasure conditioning body value $V_{BEH}$ considerably greater than $V_{DD}$. Erasure body conditioning value $V_{BEH}$ is typically 5 V above $V_{DD}$ and thus typically 8 V above $V_{SS}$.

Body-line discharge circuitry 44 is provided with erasure-only voltage $V_{EO}$ and detection voltage $V_{IM}$ which, in combination with erasure/discharge voltage $V_{ED}$ and detection voltage $V_{IT}$, largely control the timing of the main erasure and discharge portions of an erasure operation. High-voltage generator 42, body-line discharge circuitry 44, and common discharge circuitry 46 cooperate as described below to produce erasure body voltage $V_{BE}$.

In addition to erasure body voltage $V_{BE}$, body-line decoder 40 receives body-line selection (or selection/control) signals $V_{BLS}$ and an erasure-starting erasure-voltage-detection voltage signal $V_{EI}$. Programming, erase, read, sector choice, and other control functions are selected by supplying body-line selection signals $V_{BLS}$ at suitable values. Erasure-starting erasure-voltage-detection (generally simply "detection") voltage $V_{EI}$ is basically a combination of erasure-only voltage $V_{EO}$ and detection voltage $V_{IM}$. At the beginning of an erasure operation, erasure-starting detection voltage $V_{EI}$ makes a transition at largely the same time as erasure-only voltage $V_{EO}$. During the erasure discharge portion, voltage $V_{EI}$ makes a reverse transition at largely the same time as detection voltage $V_{IM}$.

Using erasure body voltage $V_{BE}$ and low supply voltage $V_{SS}$, body-line decoder 40 provides body-line voltage signals $V_{BL}$ respectively on sector body lines 70 in response to body-line selection signals $V_{BLS}$ and erasure-starting detection voltage $V_{EI}$. Each body line 70 is connected to body regions BR, including their channel portions, of all the memory cells in an associated (different) one of the EPROM sectors. Hence, one line 70 is connected to regions BR of all FETs 20 in the illustrated sector.

Each body-line voltage $V_{BL}$ is provided from body-line decoder 40 so as to settle at $V_{BEH}$ or $V_{SS}$ during EPROM operation. When body-line selection signals $V_{BLS}$ are at values that select the EPROM sector of FIG. 1, further setting signals $V_{BLS}$ to select erasure causes body-line signal $V_{BL}$ on body line 70 connected to body regions BR of FETs 20 in the illustrated EPROM sector to go from $V_{SS}$ to high erasure body conditioning value $V_{BEH}$, again typically 8 V above $V_{SS}$, during the main portion of the erasure operation. With control-line voltages $V_{CL}$ on all control lines 62 in the illustrated sector simultaneously going from $V_{SS}$ to low erasure control conditioning value $V_{CEL}$, again typically 10 V below $V_{SS}$, during the main erasure portion, all of FETs 20 in the illustrated sector are simultaneously erased. Body-line voltage $V_{BL}$ on body line 70 for the selected sector is returned to $V_{SS}$ during the erasure discharge portion as described below.

Setting body-line selection signals $V_{BLS}$ at values that select programming or read causes body-line voltage $V_{BL}$ on body line 70 for the illustrated EPROM sector to be at $V_{SS}$. Voltage $V_{BL}$ on line 70 of the illustrated sector is also at $V_{SS}$ when the EPROM is powered but the illustrated sector is in a standby mode.

Body-line decoder 40, high-voltage generator 42, and body-line discharge circuitry 44 have been described here as parts of row/sector decoder 24 due to the interaction of body-line decoder 40 with control-line decoder 32 by way of common discharge circuitry 46. However, body-line decoder 40 does not receive row address signals $V_{RAD}$. Alternatively, decoder 40 could be viewed as part of both column/sector decoder 22 and row/sector decoder 24. Since body-line decoder 40 does not receive any of column address signals $V_{CAD}$, decoder 40 could also be viewed as separate from each of decoders 22 and 24.

Select/source decoder 30, control-line decoder 32, and body-line decoder 40 have been described here, and illustrated in FIG. 1, as separate decoders. However, control-line decoder 32 and the source-line decoding circuitry of select/source decoder 30 operate in synchronism. Part of the circuitry that processes row address signals $V_{RAD}$ and control-line selection signals $V_{CLS}$ in control-line decoder 32 can be the same as part of the circuitry that processes signals $V_{RAD}$ and source-line selection signals $V_{SLS}$ in select/source decoder 30. One of signals $V_{CLS}$ is one of signals $V_{SLS}$. Accordingly, the total amount of circuitry needed for decoders 30, 32, and 40 can be reduced by partially merging them together. Additionally, part of the voltage-generation circuitry in select/source decoder 30 can be the same as part of the charge pump that implements high-voltage generator 38 and/or the same as part of the charge pump that implements high-voltage generator 42. The total amount of circuitry can thus be further reduced by merging the voltage-generation circuitry of select/source decoder 30 with one or both of high-voltage generators 38 and 42.

Figure 4:
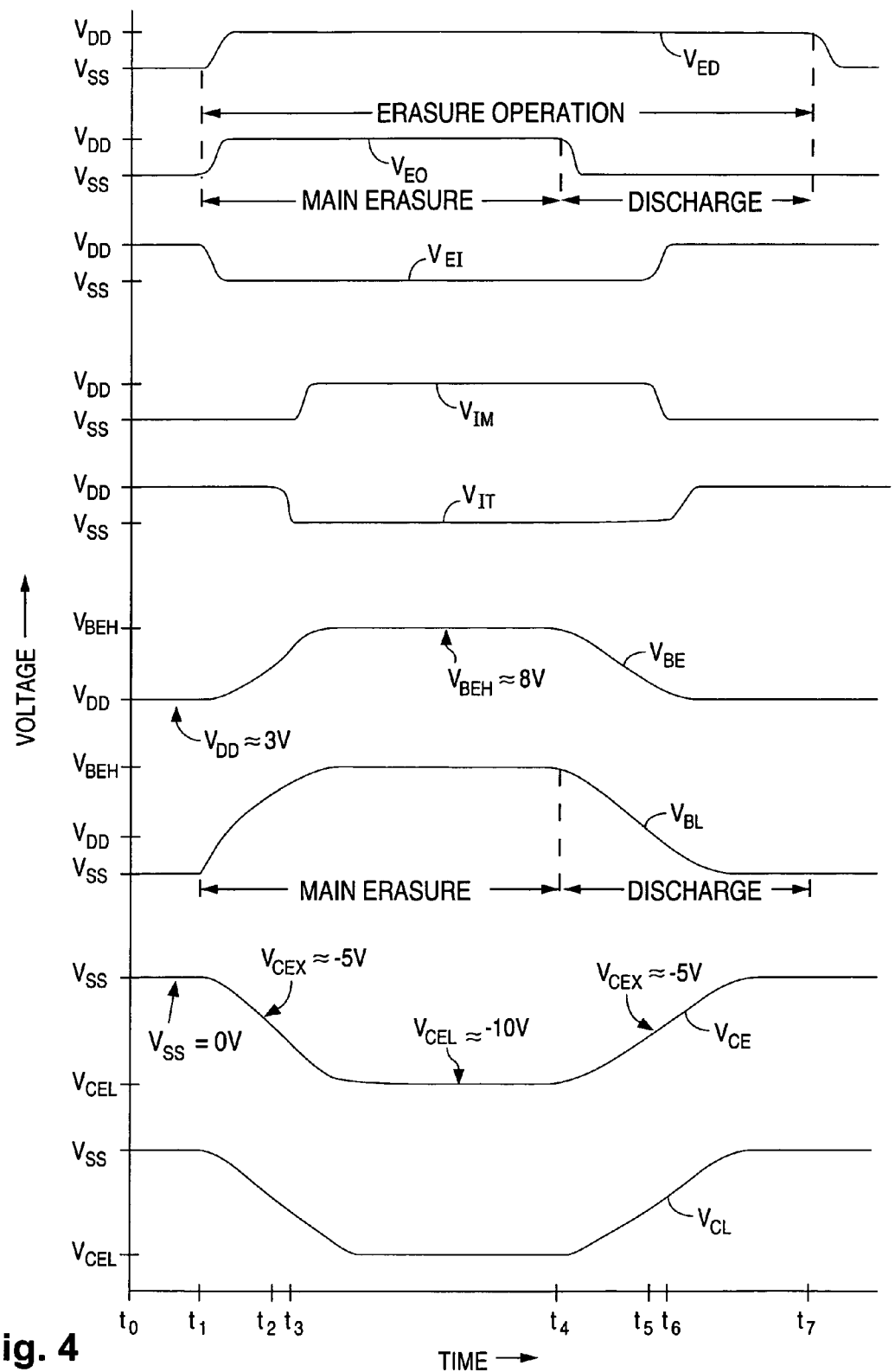
FIG. 4 is a timing diagram for certain voltages in the EPROM of FIG. 1.

With the foregoing in mind, a fuller understanding of how discharge circuitries 36, 44, and 46 are utilized with control-line decoder 32 and body-line decoder 40 in performing an erasure operation is facilitated with the assistance of the voltage timing curves shown in FIG. 4. The $V_{BL}$ curve in FIG. 4 indicates how body-line voltage $V_{BL}$ varies on body line 70 for the EPROM sector illustrated in FIG. 1 during an erasure operation. The $V_{CL}$ curve indicates how control-line voltage $V_{CL}$ varies on any of control lines 62 in the illustrated sector during erasure. Erasure/discharge voltage $V_{ED}$, erasure-only voltage $V_{EO}$, erasure-starting detection voltage $V_{EI}$, and detection voltages $V_{IM}$ and $V_{IT}$ all make transitions between $V_{SS}$ (low) and $V_{DD}$ (high).

Each memory cell FET 20 contains a logic "0" or a logic "1" immediately before an erasure operation. That is, each FET 20 is initially in the erased condition at logic "1" with the cell's programmable threshold voltage less than first transition value $V_{T1}$ or is initially in the programmed condition at logic "0" with the cell's programmable threshold voltage greater than second transition value $V_{T2}$.

The EPROM is prepared for an erasure operation by placing selection signals $V_{SGS}$, $V_{SLS}$, $V_{CLS}$, and $V_{BLS}$, along with the control signals (not shown) to column/sector decoder 22, at values that select erasure for the illustrated EPROM sector. The preparation for erasure is completed at or shortly before initial time $t_0$. Bit-line voltages $V_D$ on all bit lines 26 for the illustrated sector float. Source-line voltages $V_{SL}$ on all source lines 52 for the illustrated sector likewise float. Select-line voltages $V_{SG}$ on all word lines 50 for the illustrated sector go to $V_{ITM}$, again typically 2 V above $V_{SS}$ and thus 1 V below $V_{DD}$. At initial time $t_0$, erasure/discharge voltage $V_{ED}$, erasure-only voltage $V_{EO}$, and detection voltage $V_{IM}$ are all low ($V_{SS}$) while erasure-starting detection voltage $V_{EI}$ and detection voltage $V_{IT}$ are both high ($V_{DD}$).

The low $V_{EO}$ and high $V_{IM}$ values at time $t_0$ cause body-line discharge circuitry 44 to electrically connect line 66 to the $V_{DD}$ supply. Due to the low $V_{EO}$ value, the voltage on line 68 is not significantly affected by common discharge circuitry 46 at time $t_0$. Generator control signal $V_{BHC}$ is initially at a value that causes high-voltage generator 42 to be turned off. At time $t_0$, generator 42 therefore does not significantly affect the voltage on line 64. Consequently, body node $N_B$ at the intersection of lines 64, 66, and 68 is effectively electrically disconnected from common discharge circuitry 46 and high-voltage generator 42 at time $t_0$.

Figure 14:
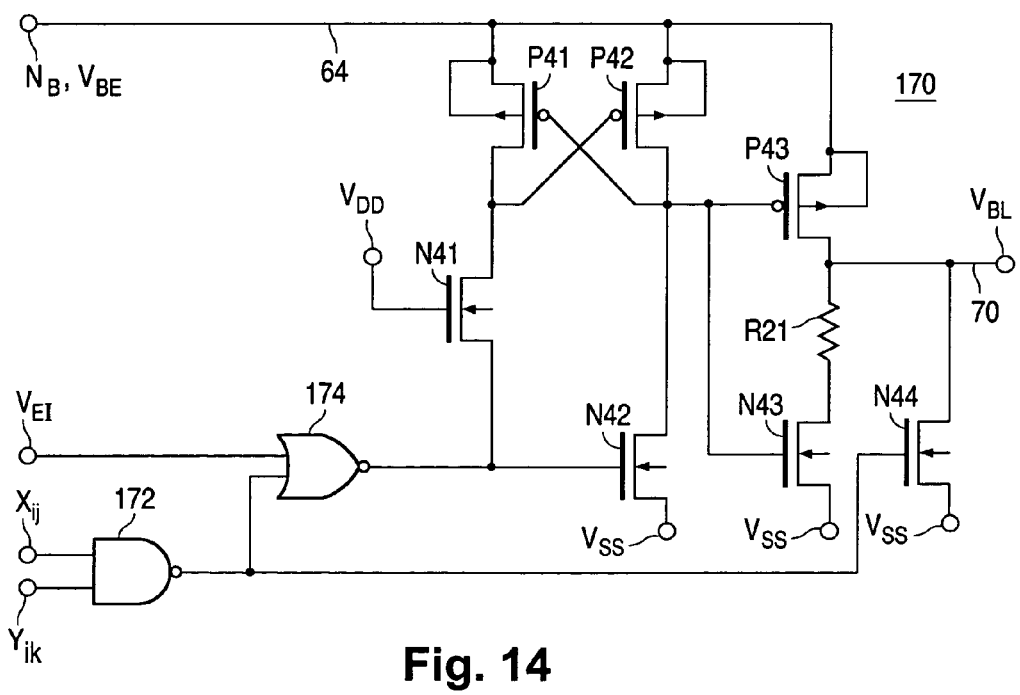

Prior to selecting the illustrated EPROM sector for an erasure operation, body line 70 for the selected sector is typically connected to the $V_{SS}$ supply by a pair of electrical paths through body-line decoder 40 as described below in connection with FIG. 14. One of the paths include one or more resistors and provides a soft electrical connection to the $V_{SS}$ supply. The other path provides a hard electrical connection to the $V_{SS}$ supply.

The $V_{BLS}$ selection-signal values that result in the selection of the illustrated EPROM sector at time $t_0$ cause body line 70 for the selected sector to be electrically disconnected from the $V_{SS}$ supply by the hard electrical path through body-line decoder 40. However, line 70 for the selected sector remains electrically connected to the $V_{SS}$ supply by way of the soft electrical path through decoder 40. Hence, body-line voltage $V_{BL}$ on line 70 for the illustrated sector equals $V_{SS}$ at time $t_0$. Line 70 for the illustrated sector is also electrically disconnected from line 64 at time $t_0$ so that decoder 40 does not affect erasure body voltage $V_{BE}$ at body node $N_B$. Since node $N_B$ is initially electrically connected through line 66 and body-line discharge circuitry 44 to the $V_{DD}$ supply, voltage $V_{BE}$ equals $V_{DD}$, the preferred erasure body conditioning value, at time $t_0$.

The low $V_{ED}$, $V_{EO}$, and $V_{IM}$ values at time $t_0$ in combination with the high $V_{IT}$ value cause control-line discharge circuitry 36 to electrically connect line 56 to the $V_{SS}$ supply. When circuitry 36 contains strong-ground and weak-ground circuitries, both the strong-ground and weak-ground circuitries connect line 56 to the $V_{SS}$ supply. Due to the low $V_{EO}$ value, the voltage on line 58 is not significantly affected by common discharge circuitry 46 at time $t_0$. Generator control signal $V_{CLC}$ is initially at a value that causes low-voltage generator 34 to be turned off. At time $t_0$, generator 34 thus has no significant effect on the voltage on line 54. Accordingly, control node $N_C$ at the intersection of lines 54, 56, and 58 is effectively electrically disconnected from common discharge circuitry 46 and low-voltage generator 34 at time $t_0$. Because circuitry 46 is also initially effectively electrically disconnected from body node $N_B$, circuitry 46 electrically isolates nodes $N_B$ and $N_C$ from each other at time $t_0$.

At time $t_0$ and during the entire erasure operation, generator control signal $V_{CHC}$ is at a value that causes high-voltage generator 38 be turned off. Hence, generator 38 does not significantly affect control programming voltage $V_{CP}$ on line 60 to control-line decoder 32 during erasure. Accordingly, generator 38 has no significant effect on erasure control voltage $V_{CE}$ during erasure.

Prior to selecting the illustrated EPROM sector for erasure, control lines 62 for the selected sector are typically connected to the $V_{SS}$ supply by an electrical path through control-line decoder 32. At time $t_0$, the combination of the low $V_{IM}$ value, the high $V_{IT}$ value, and the $V_{CLS}$ selection-signal values that lead to the selection of the illustrated EPROM sector (a) causes this electrical path to be broken so that control lines 62 for the illustrated sector are no longer electrically connected through decoder 32 to the $V_{SS}$ supply and (b) simultaneously causes decoder 32 to electrically connect line 54 to control lines 62 for the illustrated sector. Since erasure control voltage $V_{CE}$ is present at control node $N_C$ on line 54 and since node $N_C$ is initially connected through line 56 and control-line discharge circuitry 36 to the $V_{SS}$ supply, erasure control voltage $V_{CE}$ and control-line voltages $V_{CL}$ for the illustrated sector all equal $V_{SS}$, the preferred erasure control discharge value, at time $t_0$.

The main erasure portion of the overall erasure operation begins at time $t_0$. Erasure/discharge voltage $V_{ED}$ and erasure-only voltage $V_{EO}$ transition high while erasure-starting detection voltage $V_{EI}$ transitions low. The high $V_{EO}$ value causes line 66 to be electrically disconnected from the $V_{DD}$ supply through body-line discharge circuitry 44. The high $V_{EO}$ value also causes common discharge circuitry 46 to reinforce the electrical isolation that it provides between nodes $N_B$ and $N_C$. With body node $N_B$ substantially electrically isolated from body-line discharge circuitry 44 and common discharge circuitry 46, generator control signal $V_{BHC}$ changes to a value that causes high-voltage generator 42 to turn on. Generator 42 then pumps erasure body voltage $V_{BE}$ upward from body discharge value $V_{DD}$ to high body conditioning value $V_{BEH}$.

The low $V_{EI}$ value at time $t_1$ (a) causes body line 70 for the illustrated EPROM sector to be fully electrically disconnected from the $V_{SS}$ supply through body-line decoder 40, i.e., line 70 for the selected sector now becomes electrically disconnected from the $V_{SS}$ supply via the soft electrical path through decoder 40, and (b) simultaneously causes decoder 40 to electrically connect line 64 to body line 70 for the illustrated sector. Erasure body voltage $V_{BE}$ then pulls body-line voltage $V_{BL}$ for the selected sector upward from $V_{SS}$ to $V_{BEH}$. Erasure body voltage $V_{BE}$ is thereby converted into body-line voltage $V_{BL}$ for the selected sector during erasure.

The high $V_{ED}$ and $V_{EO}$ values at time $t_1$, cause line 56 to be electrically disconnected from the $V_{SS}$ supply through control-line discharge circuitry 36. This applies to both the strong-ground and weak-ground circuitries in control-line discharge circuitry 36 when it so implemented. With control node $N_C$ substantially electrically isolated from control-line discharge circuitry 36 and common discharge circuitry 46, generator control signal $V_{CLC}$ changes to a value that causes low-voltage generator 34 to turn on. This enables generator 34 to pump erasure control voltage $V_{CE}$ downward from control discharge value $V_{SS}$ to low control conditioning value $V_{CEL}$. Line 54 remains electrically connected through control-line decoder 32 to control lines 62 for the selected EPROM sector. Erasure control voltage $V_{CE}$ then pulls control-line voltages $V_{CL}$ for the selected sector downward from $V_{SS}$ to $V_{CEL}$. In this way, erasure control voltage $V_{CE}$ is converted into control-line voltages $V_{CL}$ for the selected sector during erasure.

Erasure control voltage $V_{CE}$ is detected by suitable voltage-detection circuitry (not shown) which produces the above-mentioned additional erasure-voltage-detection voltage (not shown in FIG. 4) and causes the additional detection voltage to make transitions when voltage $V_{CE}$ passes (upward and downward) through a specified detected value $V_{CEX}$ between $V_{SS}$ and low value $V_{CEL}$. Detected value $V_{CEX}$ is typically 5 V below $V_{SS}$.

Detection voltages $V_{IT}$ and $V_{IM}$ are generated from the additional detection voltage by voltage-generation circuitry (not shown) which causes detection voltage $V_{IT}$ to transition low at time $t_2$ during the main portion of the erasure operation as erasure control voltage $V_{CE}$ passes value $V_{CEX}$ in moving downward from $V_{SS}$ to $V_{CEL}$. The voltage-generation circuitry delays detection voltage $V_{IM}$ by a selected initial time delay, typically 100 ns, from detection voltage $V_{IT}$ so that detection voltage $V_{IM}$ transitions high at slightly later time $t_3$ as voltage $V_{CE}$ continues moving downward to $V_{CEL}$. These two transitions prepare discharge circuitries 44 and 36 for later transitions in voltages $V_{IM}$ and $V_{IT}$ but do not affect erasure voltage $V_{BE}$ or $V_{CE}$. The $V_{IT}$ transition at time $t_2$ and the $V_{IM}$ transition at time $t_3$ likewise do not affect the electrical connection of line 54 to control lines 62 for the illustrated EPROM sector.

Erasure control voltage $V_{CE}$ and control-line voltages $V_{CL}$ for the illustrated EPROM sector reach low control conditioning value $V_{CEL}$ approximately simultaneously at a time subsequent to time $t_3$. Erasure body voltage $V_{BE}$ and body-line voltage $V_{BL}$ for the selected sector reach high body conditioning value $V_{BEH}$ approximately simultaneously at a time subsequent to time $t_1$. With all of bit-line voltages $V_D$ and source-line voltages $V_{SL}$ for the illustrated EPROM sector still floating and with all of select-line voltages $V_{SG}$ for the illustrated sector still at $V_{ITM}$, the combination of the high $V_{BEH}$ value of body-line voltage $V_{BL}$ for the illustrated sector and the low $V_{CEL}$ value of control-line voltages $V_{CL}$ for the illustrated sector causes all of floating-gate memory FETs 20 to be erased simultaneously to logic "1".

More particularly, electrons on floating gate FG of each, if any, FET 20 which was initially in the programmed condition at logic "0" with that FET's programmable threshold voltage greater than second transition value $V_{T2}$ tunnel through gate dielectric GD of that FET 20 to its body region BR, specifically that FET's channel portion, to place that FET 20 in the erased condition at logic "1" with that FET's programmable threshold voltage less than first transition value $V_{T1}$. The tunneling mechanism is Fowler-Nordheim tunneling. Each FET 20, if any, which was initially in the erased condition at logic "1" with that FET's programmable threshold voltage less than $V_{T1}$ remains in the erased condition. At the end of the main portion of the erasure operation, each FET 20 is in the erased condition regardless of that FET's immediately previous condition.

The main portion of the erasure operation ends at time $t_4$ as generator control signals $V_{BHC}$ and $V_{CLC}$ change to values that respectively cause high-voltage generator 42 and low-voltage generator 34 to turn off. Body node $N_B$ again effectively becomes electrically disconnected from generator 42. Control node $N_C$ likewise again effectively becomes electrically disconnected from generator 34.

Erasure-only voltage $V_{EO}$ transitions low at time $t_4$ to begin the discharge portion of the erasure operation. The low $V_{EO}$ value causes common discharge circuitry 46 to electrically connect nodes $N_B$ and $N_C$ to each other by way of an electrical path through circuitry 46. This enables erasure body voltage $V_{BE}$ to start discharging downward toward an erasure body discharge value between body conditioning value $V_{BEH}$ and control conditioning value $V_{CEL}$. The electrical connection of nodes $N_B$ and $N_C$ causes erasure control voltage $V_{CE}$ to simultaneously start discharging upward toward an erasure control discharge value between conditioning values $V_{BEH}$ and $V_{CEL}$.

The erasure body discharge value is greater than or equal to the erasure control discharge value. Preferably, the body discharge value is somewhat greater than the control discharge value. In a preferred implementation, the body discharge value is high supply value $V_{DD}$ as indicated above while the control discharge value is low supply value $V_{SS}$ as likewise indicated above. Supply values $V_{DD}$ and $V_{SS}$ are respectively used as the body and control discharge values in the material below. The body discharge value exceeds the control discharge value by the supply-voltage range $V_{DD}$–$V_{SS}$, typically 3 V.

Line 64 continues to be electrically connected to body line 70 for the illustrated EPROM sector. Accordingly, erasure body voltage $V_{BE}$ starts to pull body-line voltage $V_{BL}$ for the illustrated sector downward. Line 54 likewise continues to be electrically connected to control lines 62 for the illustrated sector. Erasure control voltage $V_{CE}$ thereby starts pulling control-line voltages $V_{CL}$ for the illustrated sector upward to control discharge value $V_{SS}$.

During the discharge portion of the erasure operation, the voltage-generation circuitry which generates detection voltages $V_{IT}$ and $V_{IM}$ from the additional detection voltage produced by the voltage-detection circuitry that detects erasure control voltage $V_{CE}$ causes detection voltage $V_{IM}$ to transition low at time $t_5$ as control voltage $V_{CE}$ passes value $V_{CEX}$ in moving upward from $V_{CEL}$ to control discharge value $V_{SS}$. With erasure control voltage $V_{CE}$ already being low, the low $V_{IM}$ value causes body-line discharge circuitry 44 to electrically connect the $V_{DD}$ supply to line 66 connected to body node $N_B$. This establishes an additional discharge path for erasure body voltage $V_{BE}$ to the $V_{DD}$ supply. Circuitry 44 thereby assists common discharge circuitry 46 in pulling voltage $V_{BE}$ downward.

The low $V_{IM}$ value also causes control-line discharge circuitry 36 to electrically connect the $V_{SS}$ supply to line 56 connected to control node $N_C$. This connection similarly establishes an additional path for discharging erasure control voltage $V_{CE}$ to the $V_{SS}$ supply. Consequently, circuitry 36 assists common discharge circuitry 46 in pulling voltage $V_{CE}$ upward to control discharge value $V_{SS}$. When control-line discharge circuitry 36 contains strong-ground and weak-ground circuitries, the connection of line 56 to the $V_{SS}$ supply is made through the weak-ground circuitry at time $t_5$. The current path for line 56 through the weak-ground circuitry to the $V_{SS}$ supply preferably includes one or more resistors that limit the current in order to prevent the EPROM from being damaged.

Erasure-starting detection voltage $V_{EI}$ transitions high at time $t_5$ as detection voltage $V_{IM}$ goes low. The high $V_{EI}$ value (a) causes body-line decoder 40 to electrically disconnect body line 70 for the illustrated EPROM sector from line 64 and (b) simultaneously causes body line 70 for the illustrated sector to be electrically connected to the $V_{SS}$ supply by way of the hard electrical path through decoder 40. Since line 64 carries erasure body voltage $V_{BE}$, body-line voltage $V_{BL}$ for the illustrated sector becomes electrically isolated from voltage $V_{BE}$. With body line 70 for the illustrated sector now being electrically connected to the $V_{SS}$ supply, body-line voltage $V_{BL}$ for the illustrated sector is then pulled downward past body discharge value $V_{DD}$ to $V_{SS}$.

The voltage-generation circuitry which generates detection voltages $V_{IM}$ and $V_{IT}$ delays detection voltage $V_{IT}$ by a selected further time delay, typically 100 ns, from detection voltage $V_{IM}$ so that detection voltage $V_{IT}$ transitions high at time $t_6$ slightly later than time $t_5$ while erasure control voltage $V_{CE}$ continues moving upward to control discharge value $V_{SS}$. The high $V_{IT}$ value prepares control-line discharge circuitry 36 for the subsequent high-to-low transition in erasure/discharge voltage $V_{ED}$ but does not affect erasure body voltage $V_{BE}$. The $V_{IM}$ transition at time $t_5$ and the $V_{IT}$ transition at time $t_6$ prepare control-line decoder 32 for the completion of erasure but do not affect the electrical connection of line 54 to control lines 62 for the illustrated EPROM sector.

Voltages $V_{BE}$ and $V_{CE}$ reach their respective discharge values $V_{DD}$ and $V_{SS}$ subsequent to time $t_6$. This causes voltages $V_{BL}$ and $V_{CL}$ for the illustrated EPROM sector to reach $V_{SS}$ subsequent to time $t_6$. As voltages $V_{BE}$ and $V_{CE}$ get close to their respective discharge values $V_{DD}$ and $V_{SS}$, common discharge circuitry 46 automatically breaks the electrical path that electrically connects nodes $N_B$ and $N_C$. Circuitry 46 thus again electrically isolates nodes $N_B$ and $N_C$ from each other.

The erasure operation specifically, the discharge portion, ends when erasure/discharge voltage $V_{ED}$ transitions low at time $t_7$. When control-line discharge circuitry 36 contains strong-ground and weak-ground circuitries, the low $V_{ED}$ value causes line 56 to be electrically connected to the $V_{SS}$ supply through the strong-ground circuitry. Inasmuch as the resistor(s) in the current path from line 56 through the weak-ground circuitry to the $V_{SS}$ supply could cause erasure control voltage $V_{CE}$ to vary somewhat from $V_{SS}$, the strong-ground circuitry holds voltage $Y_{CE}$ close to $V_{SS}$.

Body-line selection signals $V_{BLS}$ and control-line selection signals $V_{CLS}$ subsequently return to values that deselect the illustrated EPROM sector. The combination of the then-existing high $V_{EI}$ value and the $V_{BLS}$ values that deselect the illustrated sector causes body line 70 for the illustrated sector to be electrically connected to the $V_{SS}$ supply by way of the hard electrical path through body-line decoder 40. This enables body-line voltage $V_{BL}$ on line 70 for the illustrated sector to be held close to $V_{SS}$. At the same time, the then-existing low $V_{IM}$ and high $V_{IT}$ values in combination with the $V_{CLS}$ values that deselect the illustrated sector (a) cause control-line decoder 32 to electrically disconnect line 54 from control lines 62 for the illustrated sector and (b) simultaneously cause control lines 62 for the illustrated sector to be electrically connected to the $V_{SS}$ supply by way of the above-mentioned electrical path through decoder 32. As a result, decoders 40 and 32 are returned to the conditions that they were in prior to selection of the illustrated sector.

The (rising/falling) directions in which voltages $V_{ED}$, $V_{EO}$, $V_{EI}$, $V_{IM}$, and $V_{IT}$ variously make transitions at times $t_0$–$t_7$ are exemplary. Each of voltages $V_{ED}$, $V_{EO}$, $V_{EI}$, $V_{IM}$, and $V_{IT}$ could be replaced with a voltage signal having transitions in the opposite directions to those described above and depicted in FIG. 4 by appropriately adding one or more inverters to, or removing one or more inverters from, the output circuitry that provides each of these voltage signals or the input circuitry that receives each of these signals.

Figure 5:
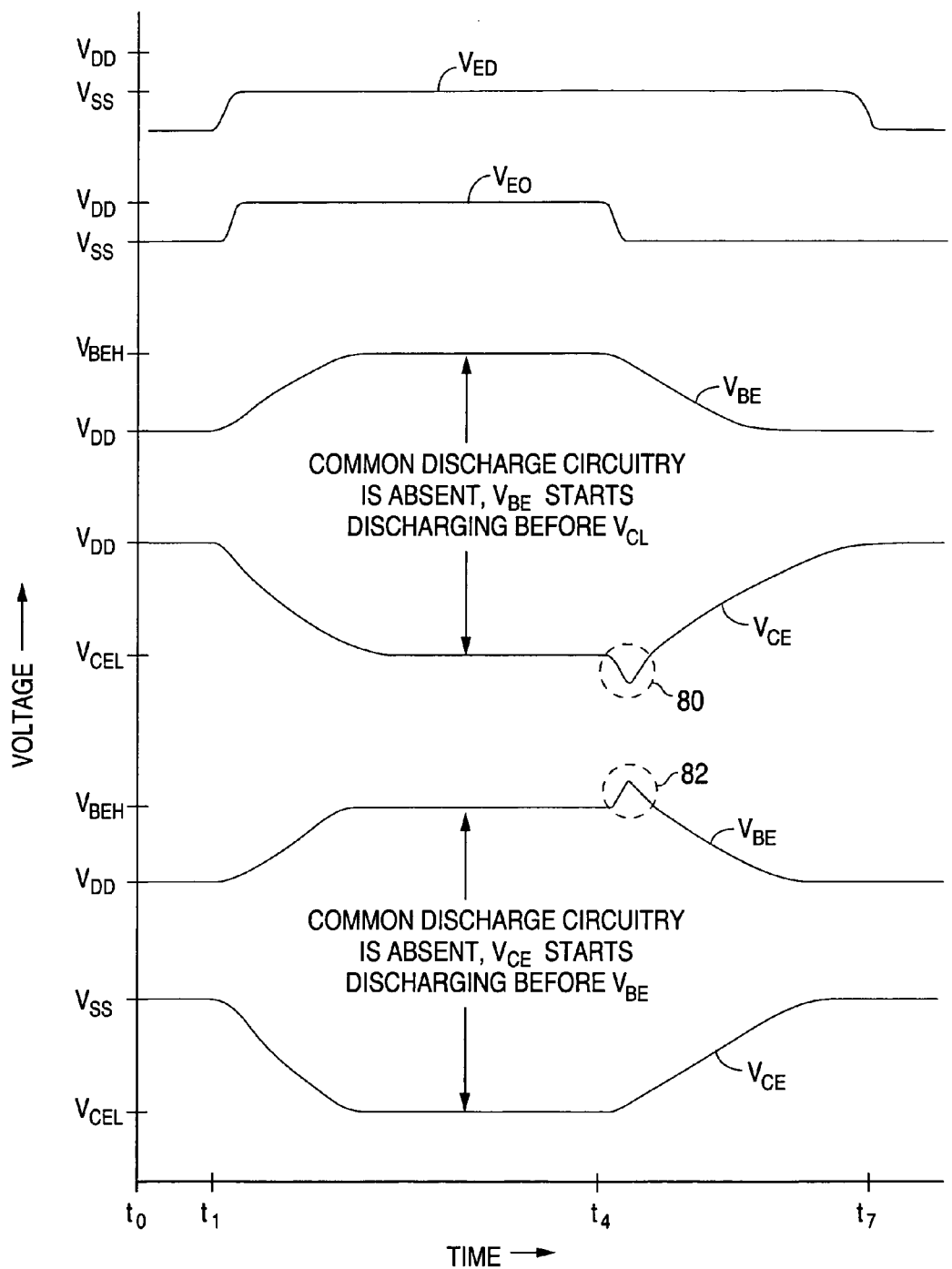
FIG. 5 is a timing diagram that indicates how certain voltages would appear in the EPROM of FIG. 1 if the common discharge circuitry of the invention were absent.

FIG. 5 presents voltage timing curves that facilitate an understanding of the benefits of the EPROM circuitry of FIG. 1. FIG. 5 specifically illustrates how erasure body voltage $V_{BE}$ and erasure control voltage $V_{CE}$ could vary during erasure if common discharge circuitry 46 were absent and if the discharge of voltages $V_{BE}$ and $V_{CE}$ respectively to $V_{DD}$ and $V_{SS}$ during the discharge portion of erasure were respectively controlled by body-line and control-line discharge circuitries similar to discharge circuitries 44 and 36 but modified to separately start discharging generally at time $t_4$ rather than providing discharge assistance, as in the invention, starting at time $t_5$ after common discharge circuitry 46 has initiated the simultaneous discharge of voltages $V_{BE}$ and $V_{CE}$ at time $t_4$.

Voltages $V_{BE}$ and $V_{CE}$ discharge in opposite (rising/falling) directions. When floating-gate memory FETs 20 are implemented with n-channel devices, erasure body voltage $V_{BE}$ discharges downward while erasure control voltage $V_{CE}$ discharges upward. The opposite occurs if FETs 20 are implemented with p-channel devices.

In a flash EPROM configured to yield the voltage timing curves of FIG. 5, one of voltages $V_{BE}$ and $V_{CE}$ could start to discharge before the other due to the separate discharge controls applied to voltages $V_{BE}$ and $V_{CE}$. Because voltages $V_{BE}$ and $V_{CE}$ discharge in opposite directions, capacitive coupling could cause the voltage $V_{BE}$ or $V_{CE}$ that starts discharging last to temporarily move in the wrong direction, i.e., to temporarily move in the opposite direction to the intended discharge direction for that voltage $V_{BE}$ or $V_{CE}$.

The middle two curves in FIG. 5 illustrate how the $V_{BE}$ and $V_{CE}$ curves would generally appear during erasure if erasure body voltage $V_{BE}$ started to discharge first. Erasure control voltage $V_{CE}$ might then initially move in the wrong direction as indicated at area 80. If erasure control voltage $V_{CE}$ started to discharge first as represented by the bottom two curves in FIG. 5, erasure body voltage $V_{BE}$ might initially move in the wrong direction as indicated at area 82. The initial wrong direction movement of voltage $V_{CE}$ (if voltage $V_{BE}$ starts to discharge first) or voltage $V_{BE}$ (if voltage $V_{CE}$ starts to discharge first) could damage the EPROM or impair its operation. The EPROM circuitry of FIG. 1 avoids this wrong-direction discharge problem by utilizing common discharge circuitry 46 to force voltages $V_{BE}$ and $V_{CE}$ to start discharging simultaneously in their respective proper directions.

Figure 6A:
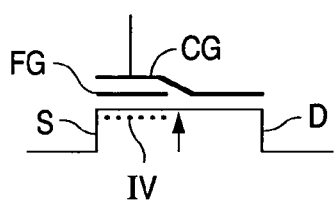
Figure 7A:
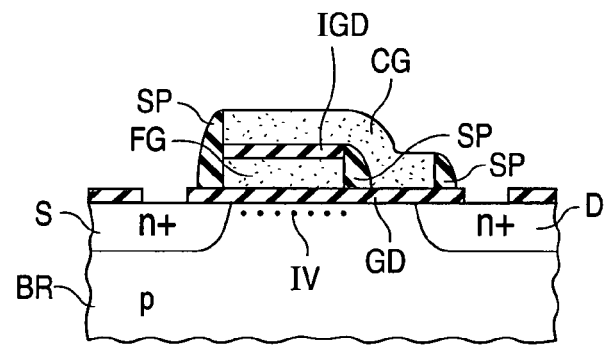
FIGS. 7a and 7b are cross-sectional views of respective embodiments of the floating-gate FETs of FIGS. 6a and 6b.
Figure 7A:
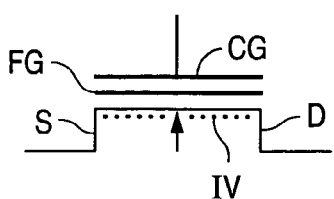

The present invention is not limited to memory cells implemented with split-gate floating-gate FETs having both control gates CG and select gates SG. For instance, the invention encompasses memory cells implemented with split-gate floating-gate FETs having control gates CG but not select gates SG. FIGS. 6a and 7a depict one such split-gate FET in which floating gate FG overlies part of the channel portion and extends partially over source S while control gate CG overlies floating gate FG, extends over the remainder of the channel portion, and extends partially over drain D. As with split-gate FET 20 having select gate SG, inversion layer IV below floating gate FG forms along only part of the upper surface of the channel portion in the memory cell of FIGS. 6a and 7a.

Figure 7B:
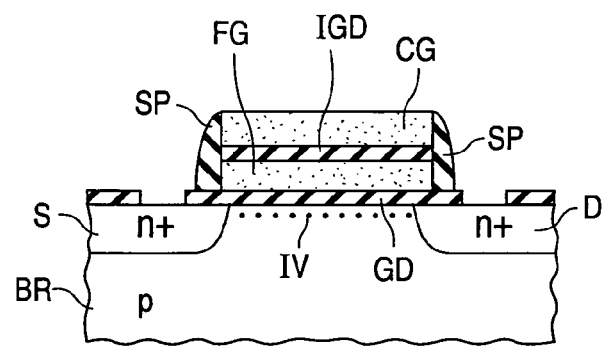

The invention likewise encompasses memory cells implemented with stacked-gate floating-gate FETs. FIGS. 6b and 7b present an example of a stacked-gate FET in which floating gate FG overlies the entire channel portion and extends partially over each of source S and drain D and in which control gate CG overlies largely all of floating gate FG. Inversion layer IV below floating gate FG in the memory cell of FIGS. 6b and 7b forms along the entire upper surface of the channel portion. Although certain circuitry, such as select/source decoder 30, would have to be modified, e.g., by deleting the select-line decoding circuitry, to directly incorporate the split-gate device of FIGS. 6a and 7a or the stacked-gate device of FIGS. 6b and 7b into the EPROM of FIG. 1, such a modification does not affect the voltage discharge principles of the invention.

Figure 8:
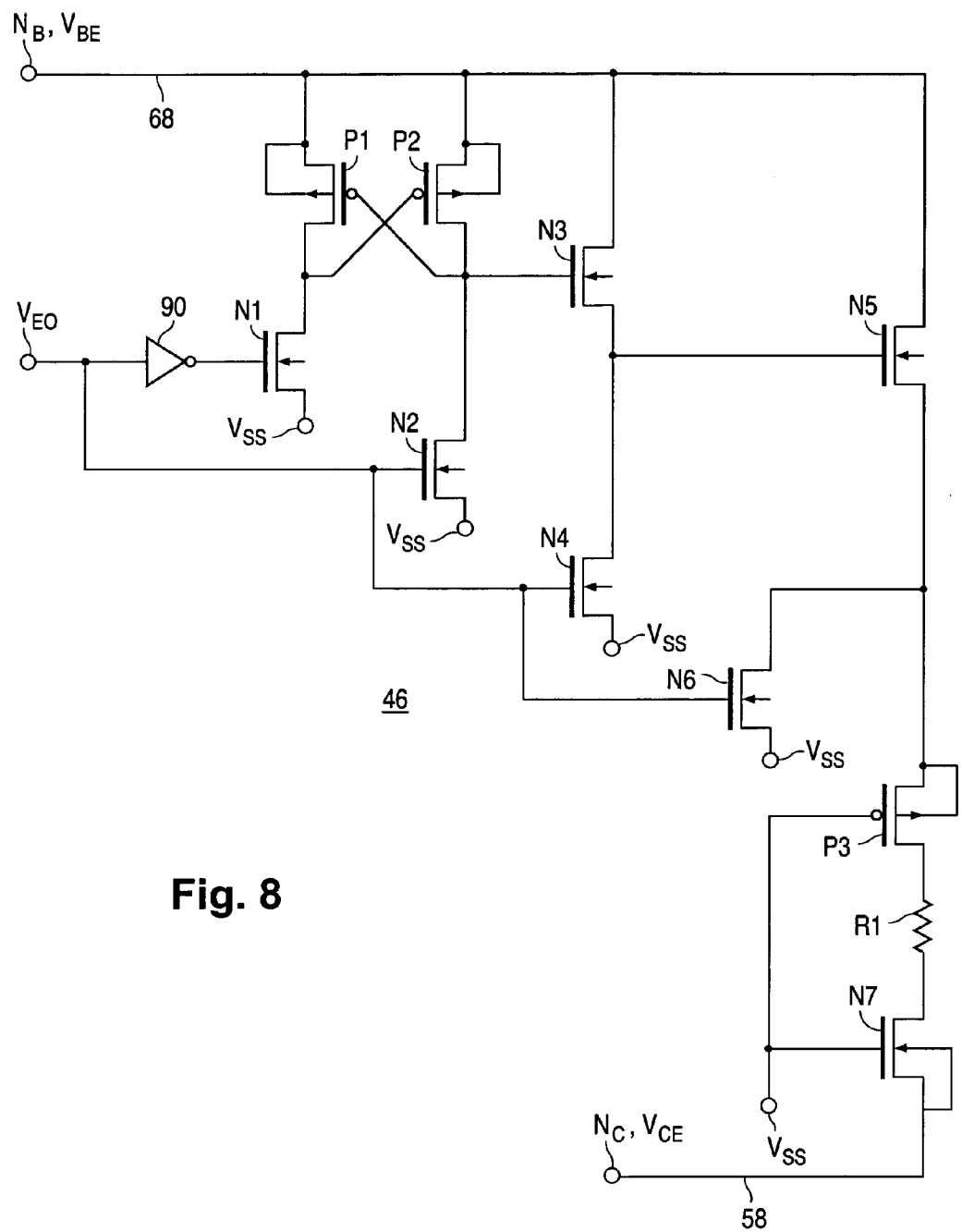

FIG. 8 presents internal details for an embodiment of common discharge circuitry 46. In this embodiment, circuitry 46 consists of n-channel FETs N1, N2, N3, N4, N5, N6, and N7, p-channel FETs P1, P2, and P3, a resistor R1, and an inverter 90 connected as shown. With additional reference to FIG. 4, FETs N1, N3, N5, P2, and P3 are all on at initial time $t_0$ prior to the beginning of erasure when erasure-only voltage $V_{EO}$ is low. FETs N2, N4, N6, and P1 are all initially off.

The gate-to-source voltage of FET N7 equals $V_{SS}$–$V_{CE}$. For FET N7 to be turned on, its gate-to-source voltage must equal or exceed its threshold voltage, normally 0.5–1.0 V, typically 0.7 V. Since erasure control voltage $V_{CE}$ equals $V_{SS}$ at time $t_0$, the gate-to-source voltage of FET N7 at time $t_0$ is zero and thus less than its threshold voltage. FET N7 is therefore off. Even though FETs N5 and P3 are turned on at time $t_0$, the off condition of FET N7 breaks an electrical path through FETs N5, P3, R1, and N7 by which nodes $N_B$ and $N_C$ would otherwise be electrically connected to each other at time $t_0$. Hence, common discharge circuitry 46 is effectively electrically disconnected from both of nodes $N_B$ and $N_C$ at time $t_0$.

The high $V_{EO}$ value resulting from the low-to-high transition in erasure-only voltage $V_{EO}$ at time $t_1$ at the beginning of the main portion of the erasure operation causes FETs N1, N3, N5, and P2 to turn off. FETs N2, N4, N6, and P1 turn on. FET P3 remains on. The off condition of FET N5 further breaks the electrical path through elements N5, P3, R1, and N7 for electrically connecting nodes $N_B$ and $N_C$ to each other.

As erasure control voltage $V_{CE}$ starts to move in the negative direction towards low erasure control value $V_{CEL}$ during the main portion of the erasure operation, the gate-to-source voltage of FET N7 becomes greater than its threshold voltage. FET N7 thus automatically turns on shortly after time $t_1$. However, the off condition of FET N5 continues to break the electrical path through elements N5, P3, R1, and N7 by which nodes $N_B$ and $N_C$ would otherwise be electrically connected to each other.

The low $V_{EO}$ value resulting from the high-to-low transition in erasure-only voltage $V_{EO}$ at time $t_4$ at the beginning of the discharge portion of the erasure operation causes FETs N1, N3, N5, and P2 to turn back on. FETs N2, N4, N6, and P1 turn back off. FETs P3 and N7 continue to remain on.

With FETs N5, P3, and N7 turned on at time $t_4$, common discharge circuitry 46 electrically connects nodes $N_B$ and $N_C$ to each other by way of an electrical path through elements N5, P3, R1, and N7. This enables erasure control voltage $V_{CE}$ to start discharging upward toward control discharge value $V_{SS}$ as erasure body voltage $V_{BE}$ simultaneously starts discharging downward toward body discharge value $V_{DD}$. FETs N5 and N7 function as switches for making/breaking the electrical path through elements N5, P3, R1, and N7. Resistor R1 limits the current through this path in order to prevent damage to the EPROM.

As erasure control voltage $V_{CE}$ approaches control discharge value $V_{SS}$, FET N7 reaches a point at which its gate-to-source voltage drops below its threshold voltage. This point is the N7 threshold voltage below $V_{SS}$. FET N7 turns off automatically at this point to break the electrical path that previously electrically connected nodes $N_B$ and $N_C$ through elements N5, P3, R1, and N7. Common discharge circuitry 46 thereby restores the electrical isolation between nodes $N_B$ and $N_C$.

FIG. 9 presents internal details of an embodiment of body-line discharge circuitry 44 formed with n-channel FETs N11 and N12, p-channel FETs P11, P12, and P13, a NOR gate 100, and an inverter 102 connected as shown. Again further referring to FIG. 4, FETs N12 and P11 are on at time $t_0$ prior to the beginning of the erasure operation when erasure-only voltage $V_{EO}$ and detection voltage $V_{IM}$ are both low. FETs N11 and P12 are both initially off.

With FET N12 being on at time $t_0$, low supply voltage $V_{SS}$ is provided through FET N12 to the gate electrode of FET P13 whose threshold voltage is normally –0.5––1.0 V, typically –0.7 V. The P13 source/drain region physically connected to the $V_{DD}$ supply acts as the source for FET P13 at this point. The gate-to-source voltage for FET P13 at time $t_0$ is $V_{SS}-V_{DD}$, typically −3 V. Since this is less (more negative) than the P13 threshold voltage, FET P13 is turned on and electrically connects the $V_{DD}$ Supply to line 66 connected to body node $N_B$. Erasure body voltage $V_{BE}$ thus equals body discharge value $V_{DD}$ at time $t_0$.

FETs N12 and P11 turn off when erasure-only voltage $V_{EO}$ goes high at time $t_1$ to begin the main portion of the erasure operation. FETs N11 and P12 both turn on. Because FET N12 is now off, FET P13 ceases to receive low supply voltage $V_{SS}$ at its gate electrode. Accordingly, FET P13 turns off. Since FETs P11 and N12 also turn off, line 66 connected to body node $N_B$ becomes electrically isolated from both the $V_{SS}$ and $V_{DD}$ supplies. At time $t_1$, body-line discharge circuitry 44 thus becomes effectively electrically disconnected from body node $N_B$.

The low-to-high transition in detection voltage $V_{IM}$ at time $t_3$ during the main portion of the erasure operation does not affect the condition of any of FETs N11, N12, P11, P12, and P13. Because voltage $V_{IM}$ went high at time $t_3$, the high-to-low transition of erasure-only voltage $V_{EO}$ at time $t_4$ likewise does not affect the on/off condition of any of FETs N11, N12, P11, P12, and P13. That is, FETs N12, P11, and P13 are still off to effectively electrically disconnect body-line discharge circuitry 44 from body node $N_B$.

The high-to-low transition of detection voltage $V_{IM}$ at time $t_5$ during the discharge portion of the erasure operation causes FETs N12 and P11 to turn back on. FETs N11 and P12 turn back off. Because FET N12 turns on, FET P13 turns on and connects the $V_{DD}$ supply to body node $N_B$ by way of line 66. This enables body-line discharge circuitry 44 to assist common discharge circuitry 46 in pulling erasure body voltage $V_{BE}$ downward to body discharge value $V_{DD}$. FET P13 functions as a switch for making/breaking the so-produced hard electrical path through circuitry 44 and line 66 for connecting body node $N_B$ to the $V_{DD}$ supply.

FIG. 10 presents internal details of an embodiment of control-line discharge circuitry 36 that contains soft-ground circuitry 110 and hard-ground circuitry 112. Soft-ground circuitry 110 consists of n-channel FETs N21 and N22, a p-channel FET P21, resistors R11 and R12, an inverter 114, a NAND gate 116, inverters 118 and 120, and a NOR gate 122. Hard-ground circuitry 112 is formed with n-channel FETs N23 and N24, a p-channel FET P22, an inverter 124, and a NOR gate 126.

With further reference to FIG. 4, FETs N22, N24, P21, and P22 are all on at time to prior to the beginning of the erasure operation when erasure/discharge voltage $V_{ED}$, erasure-only voltage $V_{EO}$, and detection voltage $V_{IM}$ are all low and detection voltage $V_{IT}$ is high. FETs N21 and N23 are both off. Since FET N22 is on, control node $N_C$ is connected to the $V_{SS}$ supply by way of a soft electrical path through line 56 and through FET N22 and resistor R12 in soft-ground circuitry 110. With FET N24 likewise being on, node $N_C$ is further connected to the $V_{SS}$ supply by way of a hard electrical path through line 56 and through FET N24 in hard-ground circuitry 112. Consequently, erasure control voltage $V_{CE}$ equals control discharge value $V_{SS}$ at time $t_0$.

FETs N21 and N23 turn on as erasure/discharge voltage $V_{ED}$ and erasure-only voltage $V_{EO}$ both go high at time $t_1$ to begin the main portion of the erasure operation. FETs N22, N24, P21, and P22 all turn off. The off condition of FET N22 electrically disconnects control node $N_C$ from the $V_{SS}$ supply along the path through FET N22 and resistor R12 in soft-ground circuitry 110. The off condition of FET N24 similarly electrically disconnects node $N_C$ from the $V_{SS}$ supply along the path through FET N24 in hard-ground circuitry 112. Control-line discharge circuitry 36 thus becomes effectively electrically disconnected from node $N_C$ at time $t_1$.

The high-to-low transition in detection voltage $V_{IT}$ at time $t_2$ and the slightly later low-to-high transition in detection voltage $V_{IM}$ at time $t_3$ reinforce the off condition of FETs P21 and P22. The high $V_{IM}$ value causes FETs N21 and N23 to turn off. The gate electrode of FET N22 becomes effectively electrically disconnected from FETs N21 and P21. The gate electrode of FET N24 similarly becomes effectively disconnected from FETs N23 and P22. Consequently, FETs N22 and N24 remain off. Control-line discharge circuitry 36 remains electrically disconnected from control node $N_C$.

The low $V_{EO}$ value resulting from the high-to-low transition in erase-only voltage $V_{EO}$ at time $t_4$ at the beginning of the discharge portion of the erasure operation prepares hard-ground circuitry 112 for a later transition in detection voltage $V_{IT}$ but does not affect any of FETs N21, N22, N23, N24, P21, and P22. All of them remain off. Control-line discharge circuitry 36 continues to be effectively electrically disconnected from control node $N_C$.

During the discharge portion of the erasure operation, the high-to-low transition in detection voltage $V_{IM}$ at time $t_5$ causes FETs P21 and N22 to turn on. FETs N21, N23, N24, and P22 remain off. The on condition of FET N22 enables soft-ground circuitry 110 to electrically connect control node $N_C$ to the $V_{SS}$ supply by way of a soft electrical path through line 56, FET N22, and resistor R12. Circuitry 110 thereby assists common discharge circuitry 46 in pulling erasure control voltage $V_{CE}$ to control discharge value $V_{SS}$. FET N22 functions as a switch for enabling circuitry 110 to make/break the soft electrical path through elements N22 and R12 for connecting node $N_C$ to the $V_{SS}$ supply. Resistor R12 limits the current along this path to prevent damage to the EPROM.

The slightly later low-to-high transition in detection voltage $V_{IT}$ at time $t_6$ during the discharge portion causes FET N23 in hard-ground circuitry 112 to turn on. FETs P21 and N22 remain on while FETs N21, N24, and P22 remain off. Since FET N24 is still off, circuitry 112 remains effectively electrically disconnected from control node $N_C$. The high $V_{IT}$ value prepares circuitry 112 for a later transition in erasure/discharge voltage $V_{ED}$.

The low $V_{ED}$ value resulting from the high-to-low transition in erasure-only voltage $V_{ED}$ at time $t_7$ at the end of the erasure operation, specifically the discharge portion, causes FETs P22 and N24 to turn on. FET N23 turns off. FETs P21 and N22 remain on while FET N21 remains off. The on condition of FET N24 enables hard-ground circuitry 112 to connect control node $N_C$ to the $V_{SS}$ supply by way of a hard electrical path through line 56 and FET N24. This electrical path holds erasure control voltage $V_{CE}$ close to $V_{SS}$. FET N24 functions as a switch for making/breaking the hard electrical path through FET N24 for connecting node $N_C$ to the $V_{SS}$ supply. At the end of the erasure operation, node $N_C$ is thus electrically connected to the $V_{SS}$ supply by way of a hard electrical path through circuitry 112 and by way of a soft electrical path through soft-ground circuitry 110.

Referring to FIG. 11, the EPROM containing the circuitry of FIG. 1 is normally allocated into a plurality of L substantially identical mats $130_0, 130_1, \ldots 130_{L-1}$ where integer L is 8 in the example of FIG. 11. Each mat $130_i$, where i is a running integer varying from 0 to L-1, consists of an array of substantially identical simultaneously erasable EPROM sectors $140_{jk}$ as shown in FIG. 12. Integer j, the row number, varies from 0 to M-1 where M is the number of rows of sectors $140_{jk}$. Integer k, the column number, varies from 0 to N-1 where N is the number of columns of sectors $140_{jk}$. N and M are both 4 in the example of FIG. 12. The total number of sectors $140_{jk}$ is LMN, 128 in the example of FIGS. 11 and 12.

Each row of sectors $140_{jk}$ in a mat $130_i$ has a row identification signal $X_{ij}$. Each column of sectors $140_{jk}$ has a column identification signal $Y_{ik}$. A particular sector $140_{jk}$ in a particular mat $130_i$ is selected by placing identification signals $X_{ij}$ and $Y_{ik}$ at specified values, typically high voltages corresponding to logic "1".

For each sector $140_{jk}$ of each mat $130_i$, control-line decoder 32 contains a control-line sector decoder and a control-line row decoder. The control-line sector decoder converts erasure control voltage $V_{CE}$ into an intermediate control-line voltage signal $V_{CI}$. Since there are LMN sectors $140_{jk}$, decoder 32 contains LMN control-line sector decoders. The control-line row decoder for the control-line sector decoder of each sector $140_{jk}$ in each mat $130_i$ converts that sector decoder's intermediate control-line voltage $V_{CI}$ into control-line voltages $V_{CL}$ for that sector $140_{jk}$. The control-line sector decoders are normally substantially identical.

Figure 13:
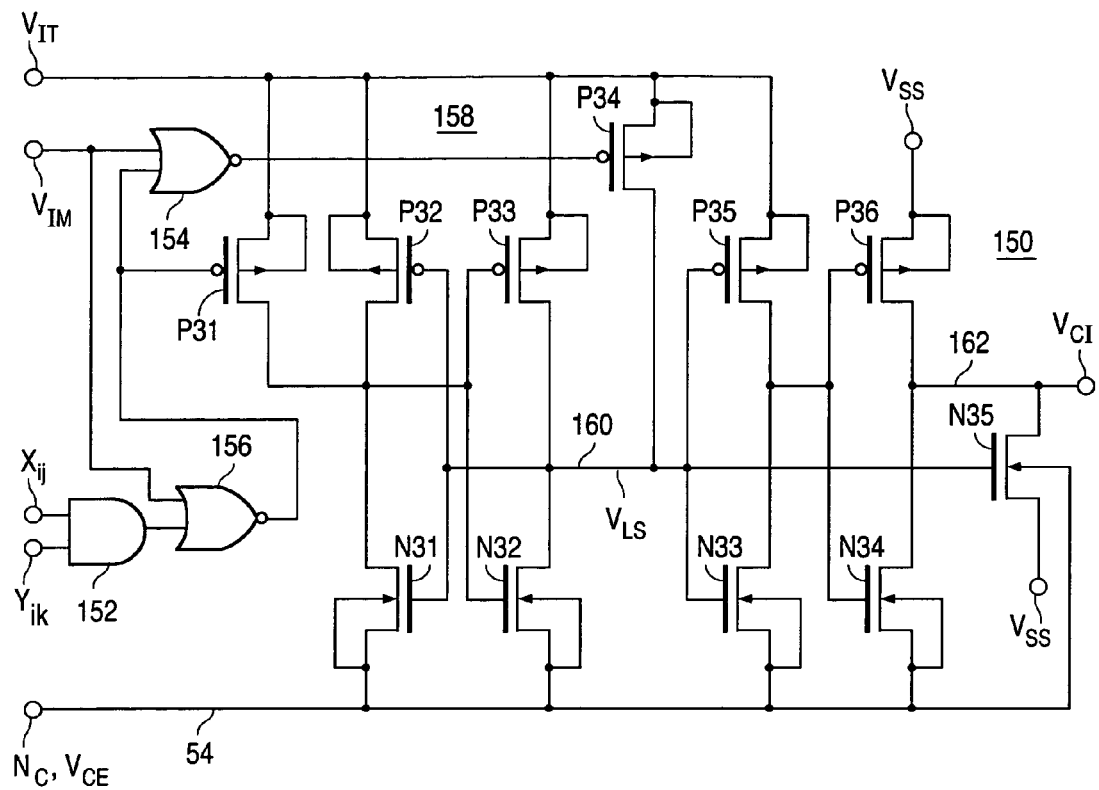
FIGS. 13 and 14 are circuit diagrams of respective embodiments of parts of the control-line and body-line decoders in the EPROM of FIG. 1.

FIG. 13 presents internal details for an embodiment of a control-line sector decoder 150 utilized in control-line decoder 32 for the EPROM sector illustrated in FIG. 1. Control-line sector decoder 150 consists of n-channel FETs N31, N32, N33, N34, and N35, p-channel FETs P31, P32, P33, P34, P35, and P36, an AND gate 152, and NOR gates 154 and 156 connected as shown. FETs N31, N32, P32, and P33 form a latch 158 that provides a latch voltage signal $V_{LS}$ on a line 160 connected to the gate electrodes of FETs N33, P35, and N35. The state of latch 158 is controlled through FETs P31 and P34. Intermediate control-line voltage $V_{CI}$ is provided on a line 162.

Prior to the selection of the EPROM sector illustrated in FIG. 1 at a point when detection voltage $V_{IM}$ is low and detection voltage $V_{IT}$ is high, at least one of sector identification signals $X_{ij}$ and $Y_{ik}$ for the illustrated sector is low (logic "0"). FET P31 is therefore off. FET P34 is on. Since voltage $V_{IT}$ equals $V_{DD}$ at this point, FET P34 pulls latch voltage $V_{LS}$ upward to $V_{DD}$ to place latch 158 in a high state. In latch 158, FETs N31 and P33 are on while FETs P32 and N32 are off. FETs N33 and N35 are also on. FETs P35, N34, and P36 are off.

Transitions in detection voltages $V_{IM}$ and $V_{IT}$ due to erasure in an EPROM sector other than the EPROM sector illustrated in FIG. 1 cause FET P34 to variously turn off and on. However, FET P31 remains off as long as sector identification signals $X_{ij}$ and $Y_{ik}$ do not go high to select the illustrated sector. In particular, FET P31 stays off when detection voltage $V_{IM}$ goes high to produce low voltage $V_{SS}$ at the P31 gate electrode because detection voltage $V_{IT}$ went low slightly earlier to place the source-acting region of FET P31 at $V_{SS}$.

When FET P34 turns off while the illustrated EPROM sector is still unselected, latch voltage $V_{LS}$ at the N31 gate electrode drops. Erasure control voltage $V_{CE}$ started dropping earlier than latch voltage $V_{LS}$. Control voltage $V_{CE}$ also drops at least as much as, normally more than, latch voltage $V_{LS}$. As a result, FET N31 remains on and allows the voltage at the P33 gate electrode to follow control voltage $V_{CE}$ downward. This enables FET P33 to remain on when detection voltage $V_{IT}$ goes low. FETs P32 and N32 remain off. As detection voltage $V_{IT}$ drops to $V_{SS}$, latch voltage $V_{LS}$ is pulled through FET P33 down to $V_{SS}$. Latch 158 therefore remains in its high state, albeit with latch voltage $V_{LS}$ reduced to $V_{SS}$, as long as the illustrated sector is unselected.

Due to the same mechanism that causes FET N31 to stay on, FET N33 stays on when FET P34 turns off while the illustrated EPROM sector is unselected. FETs P35 and N34 remain off. Reduced erasure control voltage $V_{CE}$ is transmitted through FET N33 to the P36 gate electrode. This causes FET P36 to turn on and electrically connect line 162 to the $V_{SS}$ supply. Intermediate control-line voltage $V_{CI}$ thus equals $V_{SS}$. Accordingly, control-line voltages $V_{CL}$ on all control lines 62 for the sector illustrated in FIG. 1 are at $V_{SS}$ as long as the illustrated sector is unselected.

The EPROM sector illustrated in FIG. 1 is selected by adjusting both of sector identification signals $X_{ij}$ and $Y_{ik}$ for the illustrated sector to be high (logic "1"). FET P31 turns on. FET P34, which had previously turned on when detection $V_{IT}$ went high, turns off. With further reference to FIG. 4, the high $V_{IT}$ value at time $t_0$ is transmitted through FET P31 to place latch 158 in a low state. FETs N32 and P32 turn on as FETs N31 and P33 turn off. Erasure control voltage $V_{CE}$ equals $V_{SS}$ at time $t_0$ and is transmitted through FET N32 to line 160. Latch voltage $V_{LS}$ at the N35 gate electrode thereby equals $V_{SS}$. FET N35, which had been turned on when FET P34 was turned on, turns off and ceases to electrically connect line 162 to the $V_{SS}$ supply.

FET N33 also turns off. FETs P35 and N34 turn on. FET P36, which had been turned on when erasure control voltage $V_{CE}$ was below $V_{SS}$ while the EPROM sector illustrated in FIG. 1 was unselected but which turned off when voltage $V_{CE}$ returned to $V_{SS}$, is now turned off and likewise ceases to electrically connect line 162 to the $V_{SS}$ supply. Instead, line 162 is electrically connected through FET N34 to control node $N_C$ on line 54. At time $t_0$, intermediate control-line voltage $V_{CI}$ equals voltage $V_{CE}$ which is then at $V_{SS}$.

As long as the EPROM sector illustrated in FIG. 1 is selected, subsequent transitions in detection voltage $V_{IT}$ do not affect the state of latch 158 because FET P34 stays off. Subsequent transitions in detection voltage $V_{IM}$ likewise do not affect the state of latch 158 as long as the illustrated sector is selected. FETs N32 and P32 remain on while FETs N31 and P33 remain off. FETs P35 and N34 also remain on. FET N33 remains off along with FETs N35 and P36. Accordingly, neither FET N35 nor FET P36 electrically connects the $V_{SS}$ supply to line 162 carrying intermediate voltage $V_{CI}$ during the entire selection period for the illustrated sector.

As erasure control voltage $V_{CE}$ at control node $N_C$ moves downward toward control conditioning value $V_{CEL}$ starting at time $t_1$ at the beginning of the main portion of the erasure operation, latch voltage $V_{LS}$ also moves downward toward $V_{CEL}$. This occurs because FET N32 is turned on and electrically connects line 160 that carries voltage $V_{LS}$ to line 54 that carries voltage $V_{CE}$ while FETs N35 and P36 are turned off to isolate line 160 from the $V_{SS}$ supply. FET N33 remains off. Even though detection voltage $V_{IT}$ transitions low at time $t_2$ during the main erasure portion, latch voltage $V_{LS}$ falls sufficiently from time $t_1$ to time $t_2$ that FETs P35 and N34 remain on while FETs N33, N35, and P36 remain off.

The on/off conditions of FETs P35, N33, P36, N34, and N35 continue to remain the same as detection voltage $V_{IT}$ transitions high at time $t_6$ during the discharge portion of the erasure operation. With FET N32 continuing to be turned on, latch voltage $V_{LS}$ rises to the $V_{SS}$ level as erasure control voltage $V_{CE}$ rises to control discharge value $V_{SS}$. Because FET N34 remains on while FETs P36 and N35 remain off, intermediate control-line voltage $V_{CI}$ equals erasure control voltage $V_{CE}$ during the entire erasure operation. Control-line voltages $V_{CL}$ on control lines 62 for the illustrated sector are therefore all equal to erasure control voltage $V_{CE}$ during erasure in that sector.

The maximum difference between the voltages variously applied to the FETs in control-line sector decoder 150 of FIG. 8 is $V_{DD}-V_{CEL}$, typically 13 V. Importantly, decoder 150 of FIG. 8 is configured and operated so that the maximum voltage across any of the decoder FETs at any time during decoder operation is $V_{SS}-V_{CEL}$, typically 10 V. This helps avoid damaging decoder 150 of FIG. 8 compared to what would occur if any of its FETs experienced a voltage difference of $V_{DD}-V_{CEL}$, again typically 13 V, during decoder operation.

Body-line decoder 40 contains LMN body-line sector decoders, one for each sector $140_{jk}$ of each mat $130_i$. The internal details of an embodiment of one such body-line sector decoder 170 are presented in FIG. 14. Body-line sector decoder 170 consists of n-channel FETs N41, N42, N43, and N44, p-channel FETs P41, P42, and P43, a NAND gate 172, and a NOR gate 174 connected as shown.

Prior to the selection of the EPROM sector illustrated in FIG. 1 when at least one of sector identification signals $X_{ij}$ and $Y_{ik}$ is low, FETs N41, N43, N44 and P42 are on. FETs N42, P41, and P43 are off. With FET N43 being on, the $V_{SS}$ supply is electrically connected along a soft electrical path through FET N43 and resistor R21 to body line 70 that carries body-line voltage $V_{BL}$ for the illustrated sector. The $V_{SS}$ supply is also electrically connected along a hard electrical path through FET N44 to body line 70 for the illustrated sector. Hence, voltage $V_{BL}$ for the illustrated sector is held close to $V_{SS}$ as long as the illustrated sector is unselected.

Adjusting sector identification signals $X_{ij}$ and $Y_{ik}$ so that both are high to select the illustrated sector causes FET N44 to turn off. This breaks the hard electrical path by which FET N44 electrically connected line 70 for the illustrated sector to the $V_{SS}$ supply. With further reference to FIG. 4, the high $V_{EI}$ value at time $t_0$ enables FETs N41, N43, and P42 to remain on. FETs N42, P41, and P43 remain off. Body line 70 for the EPROM sector illustrated in FIG. 1 thereby remains electrically connected to the $V_{SS}$ supply by the soft electrical path through FET N43 and resistor R21.

FETs N42, P41, and P43 turn on at time $t_1$ when erasure-starting detection voltage $V_{EI}$ goes low at the beginning of the main portion of the erasure operation. FETs N41, N43, and P42 turn off. FET N44 remains off. With FET N43 now off, body line 70 for the EPROM sector illustrated in FIG. 1 ceases to be electrically connected to the $V_{SS}$ supply by an electrical path through resistor R21 and FET N43. Instead, line 70 for the illustrated sector is electrically connected through FET P43 to line 64. As erasure body voltage $V_{BE}$ rises from $V_{DD}$ to body conditioning value $V_{BEH}$, body-line voltage $V_{BL}$ for the illustrated sector rises from $V_{SS}$ to body conditioning value $V_{BEH}$.

When erasure-starting detection voltage $V_{EI}$ returns high at time $t_5$ during the discharge portion of the erasure operation, FETs N41, N43, and P42 turn back on. FETs N42, P41, and P43 turn back off. Body line 70 for the illustrated sector then again becomes electrically connected to the $V_{SS}$ supply by way of a soft electrical path through resistor R21 and FET N43. This pulls body-line voltage $V_{BL}$ for the illustrated sector to $V_{SS}$. Resistor R21 limits current through this path to prevent EPROM damage.

The present invention has been described with reference to particular embodiments solely for the purpose of illustration. For instance, the present erasure discharge technique can be used in devices other than EPROMs. Common discharge circuitry 46, body-line discharge circuitry 44, control-line discharge circuitry 36, control-line sector decoders 150, and body-line sector decoders 170 can be implemented differently than respectively shown in FIGS. 8–10, 13, and 14. Various modifications and applications may thus be made by those skilled in the art without departing from the true scope of the invention as defined in the appended claims.

I claim:

1. A method of controlling threshold voltage characteristics of a floating-gate field-effect transistor ("FET") in which a pair of source/drain regions are separated from each other by a channel portion of a body region that forms a pn junction with each source/drain region, a floating-gate electrode overlies the channel portion, and a control-gate electrode overlies the floating-gate electrode above the channel portion, the FET being in a first condition when its programmable threshold voltage is (a) less than a first transition value $V_{T1}$ if the FET is of n-channel type and (b) greater than $-V_{T1}$ if the FET is of p-channel type, the FET being in a second condition when its programmable threshold voltage is (a) greater than a second transition value $V_{T2}$ if the FET is of n-channel type and (b) less than $-V_{T2}$ if the FET is of p-channel type where $V_{T2}$ exceeds or equals $V_{T1}$, a first body voltage at a body node being converted into a second body voltage applied to the body region, a first control voltage at a control node being converted into a second control voltage applied to the control-gate electrode, the method comprising:

placing the first body and first control voltages at respective body and control conditioning values different from each other such that the second body and second control voltages cause the FET to be in the first condition with its programmable threshold voltage (a) less $V_{T1}$ than if the FET is of n-channel type or (b) greater than $-V_{T1}$ if the FET is of p-channel type regardless of whether the FET was immediately previously in the first or second condition; and subsequently discharging the first body and first control voltages to respective body and control discharge values between the conditioning values, the body and control nodes being electrically connected to each other at least as the discharging act starts such that the first body and first control voltages begin to discharge largely simultaneously.

2. A method as in claim 1 wherein the FET is a memory element that operates between a pair of supply voltages during reading of the memory element, one of the conditioning values being greater than both supply voltages, the other of the conditioning values being less than both supply voltages.

3. A method as in claim 1 wherein $V_{T2}$ exceeds $V_{T1}$.

4. A method as in claim 1 wherein, for a specified voltage difference between the control-gate electrode and a specified one of the source/drain regions, an inversion layer (a) occurs in the channel portion below the floating-gate electrode when the FET is in the first condition and (b) does not occur there when the FET is in the second condition.

5. A method as in claim 1 wherein electrically insulating material separates the electrodes from each other and from a semiconductor body that contains the source/drain and body regions.

6. A method as in claim 1 wherein the floating-gate electrode extends partially over both source/drain regions.

7. A method as in claim 1 wherein the floating-gate electrode extends partially over only one of the source/drain regions, the control-gate electrode extending partially over the other of the source/drain regions.

8. A method as in claim 1 wherein the floating-gate electrode extends partially over only one of the source/drain regions, a select-gate electrode overlying the channel portion and extending partially over the other of the source/drain regions.

9. A method as in claim 8 wherein electrically insulating material separates the electrodes from each other and from a semiconductor body that contains the source/drain and body regions.

10. A method as in claim 8 wherein:
the placing act comprises (i) changing the first body voltage in a first rising/falling direction to cause the second body voltage to change in the first rising/falling direction and (ii) changing the first control voltage in a second rising/falling direction opposite to the first rising/falling direction to cause the second control voltage to change in the second rising/falling direction; and
the discharging act comprises (i) changing the first body voltage in the second rising/falling direction to cause the second body voltage to change in the second rising/falling direction and (ii) changing the first control voltage in the first rising/falling direction to cause the second control voltage to change in the first rising/falling direction.

11. A method as in claim 1 wherein the body and control nodes are physically connected to each other through a switch, the discharging act including closing the switch to electrically connect the body and control nodes to each other.

12. A method as in claim 11 wherein the body and control nodes are also physically connected to each other through a resistor.

13. A method as in claim 1 wherein the discharging act includes, subsequent to its start, performing at least one of:
electrically connecting the body node to a source of a body reference voltage approximately equal to the body discharge value; and
electrically connecting the control node to a source of a control reference voltage approximately equal to the control discharge value.

14. A method as in claim 13 wherein both of the electrically connecting acts are performed.

15. A method as in claim 14 wherein the electrically connecting acts are initiated in response to one of the first body and first control voltages reaching a specified value.

16. A method as in claim 14 wherein the electrical connecting acts are initiated in response to the first control voltage reaching a specified intermediate control value between the control conditioning value and the control discharge value.

17. A method as in claim 1 wherein the control discharge value is closer to the control conditioning value than is the body discharge value while the body discharge value is closer to the body conditioning value than is the control discharge value.

18. A method as in claim 1 wherein the FET is of n-channel type.

19. A method as in claim 18 wherein:
the body conditioning value exceeds the control conditioning value;
the placing act comprises (i) increasing the first body voltage to cause the second body voltage to increase and (ii) decreasing the first control voltage to cause the second control voltage to decrease; and the discharging act comprises (i) decreasing the first body voltage to cause the second body voltage to decrease and (b) increasing the first control voltage to cause the second control voltage to increase.

20. A method as in claim 1 wherein:
the placing act comprises (i) changing the first body voltage in a first rising/falling direction to cause the second body voltage to change in the first rising/falling direction and (ii) changing the first control voltage in a second rising/falling direction opposite to the first rising/falling direction to cause the second control voltage to change in the second rising/falling direction; and
the discharging act comprises (i) changing the first body voltage in the second rising/falling direction to cause the second body voltage to change in the second rising/falling direction and (ii) changing the first control voltage in the first rising/falling direction to cause the second control voltage to change in the first rising/falling direction.

21. A method as in claim 20 wherein the first and second rising/falling directions respectively are (a) rising and falling directions if the FET is an n-channel FET and (b) falling and rising directions if the FET is a p-channel FET.

22. A method as in claim 20 wherein:
the second body voltage changes substantially at least as much as the first body voltage during each of the placing and discharging acts; and
the second control voltage changes substantially at least as much as the first control voltage during each of the placing and discharging acts.

23. A method as in claim 20 wherein:
the second body voltage changes more than the first body voltage during each of the placing and discharging acts; and
the second control voltage changes substantially as much as the first control voltage during each of the placing and discharging acts.

24. A method as in claim 20 wherein the control discharge value is closer to the control conditioning value than is the body discharge value while the body discharge value is closer to the body conditioning value than is the control discharge value.

25. A method of controlling threshold-voltage characteristics of a group of like-polarity floating-gate field-effect transistors ("FETs") that respectively constitute memory elements of an electrically erasable programmable read-only memory where each FET has a pair of source/drain regions separated from each other by a channel portion of a body region that forms a pn junction with each source/drain region, a floating-gate electrode overlies the channel portion, and a control-gate electrode overlies the floating-gate electrode above the channel portion, each FET being in an erased condition when its programmable threshold voltage is (a) less than a first transition value $V_{T1}$ if that FET is of n-channel type and (b) greater than $-V_{T1}$ if that FET is of p-channel type, each FET being in a programmed condition when its programmable threshold voltage is (a) greater than a second transition value $V_{T2}$ if that FET is of n-channel type and (b) less than $-V_{T2}$ if the FET is of p-channel type where $V_{T2}$ exceeds or equals $V_{T1}$, a first body voltage at a body node being converted into a second body voltage applied to the body region, a first control voltage at a control node being converted into a plurality of second control voltages each applied to at least one of the control-gate electrodes, the method comprising:

placing the first body and first control voltages at respective body and control conditioning values different from each other such that the second body and second control voltages cause each FET to be in its erased condition with its programmable threshold voltage (a) less $V_{T1}$ if that FET is of n-channel type or (b) greater than $-V_{T1}$ if that FET is of p-channel type regardless of whether that FET was immediately previously in its erased or programmed condition; and subsequently discharging the first body and first control voltages to respective body and control discharge values between the conditioning values, the body and control nodes being electrically connected to each other at least as the discharging act starts such that the first body and first control voltages begin to discharge largely simultaneously.

26. A method as in claim 25 wherein the memory elements operate between a pair of supply voltages during reading of the memory elements, one of the conditioning values being greater than both supply voltages, the other of the conditioning values being less than both supply voltages.

27. A method as in claim 25 wherein each FET, if any, not in its erased condition immediately previous to the placing act enters its erased condition during the placing act substantially simultaneously as each other FET, if any, not in its erased condition immediately previous to the placing act.

28. A method as in claim 25 further including placing at least one of the FETs in its programmed condition while at least one other of the FETs remains in its erased condition.

29. A method as in claim 25 further including providing a specified voltage difference between the control-gate electrode of each FET and a specified one of its source/drain regions such that an inversion layer (a) occurs in the channel portion of that FET below its floating-gate electrode when that FET is in its erased condition and (b) does not occur there when that FET is in its programmed condition.

30. A method as in claim 25 wherein the discharging act includes, subsequent to its start, performing at least one of:
electrically connecting the body node to a source of a body reference voltage approximately equal to the body discharge value; and
electrically connecting the control node to a source of a control reference voltage approximately equal to the control discharge value.

31. A method as in claim 30 wherein both of the electrically connecting acts are performed.

32. A method as in claim 31 wherein the electrically connecting acts are initiated in response to one of the first body and first control voltages reaching a specified value.

33. A method as in claim 25 wherein:
the placing act comprises (i) changing the first body voltage in a first rising/falling direction to cause the second body voltage to change in the first rising/falling direction and (ii) changing the first control voltage in a second rising/falling direction opposite to the first rising/falling direction to cause each second control voltage to change in the second rising/falling direction; and
the discharging act comprises (i) changing the first body voltage in the second rising/falling direction to cause the second body voltage to change in the second rising/falling direction and (ii) changing the first control voltage in the first rising/falling direction to cause each second control voltage to change in the first rising/falling direction.

34. A method as in claim 33 wherein the first and second rising/falling directions respectively are (a) rising and falling directions if the FETs are n-channel FETs and (b) falling and rising directions if the FETs are a p-channel FETS.

35. A method as in claim 33 wherein:
the second body voltage changes substantially at least as much as the first body voltage during each of the placing and discharging acts; and
the second control voltage changes substantially at least as much as each first control voltage during each of the placing and discharging acts.

36. A method as in claim 33 wherein:
the second body voltage changes more than the first body voltage during each of the placing and discharging acts; and
the second control voltage changes substantially as much as each first control voltage during each of the placing and discharging acts.

37. An electronic circuit comprising:
a floating-gate field-effect transistor ("FET") in which a pair of source/drain regions are separated from each other by a channel portion of a body region that forms a pn junction with each source/drain region, a floating-gate electrode overlies the channel portion, and a control-gate electrode overlies the floating-gate electrode above the channel portion, the FET being in a first condition when its programmable threshold voltage is (a) less than a first transition value $V_{T1}$ if the FET is of n-channel type and (b) greater than $-V_{T1}$ if the FET is of p-channel type, the FET being in a second condition when its programmable threshold voltage is (a) greater than a second transition value $V_{T2}$ if the FET is of n-channel type and (b) less than $-V_{T2}$ if the FET is of p-channel type where $V_{T2}$ exceeds or equals $V_{T1}$, a first body voltage at a body node being converted into a second body voltage applied to the body region, a first control voltage at a control node being converted into a second control voltage applied to the control-gate electrode;
conditioning circuitry for selectively placing the first body and first control voltages at respective body and control conditioning values different from each other such that the second body and second control voltages cause the FET to be in the first condition with its programmable threshold voltage (a) less than $V_{T1}$ if the FET is of n-channel type or (b) greater than $-V_{T1}$ if the FET is of p-channel type regardless of whether the FET was immediately previously in the first or second condition; and
voltage discharge circuitry for discharging the first body and first control voltages to respective body and control discharge values between the conditioning values, the voltage discharge circuitry comprising common discharge circuitry for electrically connecting the body and control nodes to each other at least as the first body and first control voltages start discharging such that they begin to discharge largely simultaneously.

38. A circuit as in claim 37 wherein the FET is a memory element that operates between a pair of supply voltages during reading of the memory element, one of the conditioning values being greater than both supply voltages, the other of the conditioning values being less than both supply voltages.

39. A circuit as in claim 37 wherein $V_{T2}$ exceeds $V_{T1}$.

40. A circuit as in claim 37 further including accessing circuitry for selectively supplying a specified voltage difference between the control-gate electrode and a specified one of the source/drain regions such that an inversion layer (a) occurs in the channel portion below the floating-gate electrode when the FET is in the first condition and (b) does not occur there when the FET is in the second condition.

41. A circuit as in claim 37 wherein electrically insulating material separates the electrodes from each other and from a semiconductor body that contains the source/drain and body regions.

42. A circuit as in claim 37 wherein the floating-gate electrode extends partially over both source/drain regions.

43. A circuit as in claim 37 wherein the floating-gate electrode extends partially over only one of the source/drain regions, the control-gate electrode extending partially over the other of the source/drain regions.

44. A circuit as in claim 37 wherein the floating-gate electrode extends partially over only one of the source/drain regions, a select-gate electrode overlying the channel portion and extending partially over the other of the source/drain regions.

45. A circuit as in claim 44 wherein electrically insulating material separates the electrodes from each other and from a semiconductor body that contains the source/drain and body regions.

46. A circuit as in claim 37 wherein the common discharge circuitry includes a switch through which the body and control nodes are physically connected to each other, the switch being closed as the first body and first control voltages discharge so as to electrically connect the body and control nodes to each other.

47. A circuit as in claim 46 wherein the common discharge circuitry includes a resistor through which the body and control nodes are physically connected to each other.

48. A circuit as in claim 37 wherein the voltage discharge circuitry further includes at least one of:
body-line discharge circuitry for electrically connecting the body node to a source of a body reference voltage approximately equal to the body discharge value; and
control-line discharge circuitry for electrically connecting the control node to a source of a control reference voltage approximately equal to the control discharge value.

49. A circuit as in claim 48 wherein both the body-line discharge circuitry and the control-line discharge circuitry are present in the voltage discharge circuitry.

50. A circuit as in claim 49 wherein the body-line and control-line discharge circuitries respectively start assisting discharge of the first body and first control voltages in response to one of them reaching a specified value.

51. A circuit as in claim 49 wherein the body-line and control-line discharge circuitries respectively start assisting discharge of the first body and first control voltages in response to the first control voltage reaching a specified value.

52. A circuit as in claim 37 wherein the control discharge value is closer to the control conditioning value than is the body discharge value while the body discharge value is closer to the body conditioning value than is the control discharge value.

53. An electrically erasable programmable read-only memory ("EPROM") comprising:
a group of memory elements respectively comprising like-polarity floating-gate field-effect transistors ("FETs") wherein each FET has a pair of source/drain regions separated from each other by a channel portion of a body region that forms a pn junction with each source/drain region, a floating-gate electrode overlies the channel portion, and a control-gate electrode overlies the floating-gate electrode above the channel portion, each FET being in an erased condition when its programmable threshold voltage is (a) less than a first transition value $V_{T1}$ if that FET is of n-channel type and (b) greater than $-V_{T1}$ if that FET is of p-channel type, each FET being in a programmed condition when its programmable threshold voltage is (a) greater than a second transition value $V_{T2}$ if that FET is of n-channel type and (b) less than $-V_{T2}$ if that FET is of p-channel type where $V_{T2}$ exceeds or equals $V_{T1}$, a first body voltage at a body node being converted into a second body voltage applied to the body region, a first control voltage at a control node being converted into a plurality of second control voltages each applied to at least one of the control-gate electrodes;
conditioning circuitry for selectively placing the first body and first control voltages at respective body and control conditioning values different from each other such that the second body and second control voltages cause each FET to be in its erased condition with its programmable threshold voltage (a) less than $V_{T1}$ if that FET is of n-channel type or (b) greater than $-V_{T1}$ if that FET is of p-channel type regardless of whether that FET was immediately previously in its erased or programmed condition; and
voltage discharge circuitry for discharging the first body and first control voltages to respective body and control discharge values between the conditioning values, the voltage discharge circuitry comprising common discharge circuitry for electrically connecting the body and control nodes to each other at least as the first body and first control voltages start discharging such that they begin to discharge largely simultaneously.

54. An EPROM as in claim 53 wherein the memory elements operate between a pair of supply voltages during reading of the memory elements, one of the conditioning values being greater than both supply voltages, the other of the conditioning values being less than both supply voltages.

55. An EPROM as in claim 53 wherein, when the first body and first control voltages are placed at their respective body and control values, the conditioning circuitry causes each FET, if any, not immediately previously in its erased condition to enter its erased condition substantially simultaneously as each other FET, if any, not immediately previously in its erased condition.

56. An EPROM as in claim 55 further including programming circuitry for selectively placing the FETs in their programmed conditions.

57. An EPROM as in claim 53 wherein at least one of the FETs is in its programmed condition when at least one other of the FETs is in its erased condition.

58. An EPROM as in claim 53 wherein the voltage discharge circuitry further includes at least one of:
body-line discharge circuitry for electrically connecting the body node to a source of a body reference voltage approximately equal to the body discharge value; and
control-line discharge circuitry for electrically connecting the control node to a source of a control reference voltage approximately equal to the control discharge value.

59. An EPROM as in claim 58 wherein both the body-line discharge circuitry and the control-line discharge circuitry are present in the voltage discharge circuitry.

60. An EPROM as in claim 59 wherein the body-line and control-line discharge circuitries respectively start assisting discharge of the first body and first control voltages in response to one of them reaching a specified value.

61. A fabrication method comprising:

providing a floating-gate field-effect transistor ("FET") in which a pair of source/drain regions are separated from each other by a channel portion of a body region that forms a pn junction with each source/drain region, a floating-gate electrode overlies the channel portion, and a control-gate electrode overlies the floating-gate electrode above the channel portion, the FET being in a first condition when its programmable threshold voltage is (a) less than a first transition value $V_{T1}$ if the FET is of n-channel type and (b) greater than $-V_{T1}$ if the FET is of p-channel type, the FET being in a second condition when its programmable threshold voltage is (a) greater than a second transition value $V_{T2}$ if the FET is of n-channel type and (b) less than $-V_{T2}$ if the FET is of p-channel type where $V_{T2}$ exceeds or equals $V_{T1}$, a first body voltage at a body node being convertible into a second body voltage applied to the body region, a first control voltage at a control node being convertible into a second control voltage applied to the control-gate electrode;

providing conditioning circuitry for selectively placing the first body and first control voltages at respective body and control conditioning values different from each other such that the second body and second control voltages cause the FET to be in the first condition with its programmable threshold voltage (a) less than $V_{T1}$ if the FET is of n-channel type or (b) greater than $-V_{T1}$ if the FET is of p-channel type regardless of whether the FET was immediately previously in the first or second condition; and providing voltage discharge circuitry (i) for discharging the first body and first control voltages to respective body and control discharge values between the conditioning values and (ii) for electrically connecting the body and control nodes to each other at least as the first body and first control voltages start discharging such that they begin to discharge largely simultaneously.

62. A method as in claim 61 wherein the act of providing the voltage discharge circuitry further includes providing the voltage discharge circuitry to do at least one of (i) electrically connect the body node to a source of a body reference voltage approximately equal to the body discharge value and (ii) electrically connect the control node to a source of a control reference voltage approximately equal to the control discharge value.

63. A method of fabricating an electrically erasable programmable read-only memory ("EPROM"), the method comprising:

providing a group of memory elements for the EPROM, the memory elements respectively comprising like-polarity floating-gate field-effect transistors ("FETs") wherein each FET has a pair of source/drain regions separated from each other by a channel portion of a body region that forms a pn junction with each source/drain region, a floating-gate electrode overlies the channel portion, and a control-gate electrode overlies the floating-gate electrode above the channel portion, each FET being in an erased condition when its programmable threshold voltage is (a) less than a first transition value $V_{T1}$ if that FET is of n-channel type and (b) greater than $-V_{T1}$ if that FET is of p-channel type, each FET being in a programmed condition when its programmable threshold voltage is (a) greater than a second transition value $V_{T2}$ if that FET is of n-channel type and (b) less than $-V_{T2}$ if that FET is of p-channel type where $V_{T2}$ exceeds or equals $V_{T1}$, a first body voltage at a body node being convertible into a second body voltage applied to the body region, a first control voltage at a control node being convertible into a plurality of second control voltages each applied to at least one of the control-gate electrodes;

providing conditioning circuitry for selectively placing the first body and first control voltages at respective body and control conditioning values different from each other such that the second body and second control voltages cause each FET to be in its erased condition with its programmable threshold voltage (a) less than $V_{T1}$ if that FET is of n-channel type or (b) greater than $-V_{T1}$ if that FET is of p-channel type regardless of whether that FET was immediately previously in its erased or programmed condition; and providing voltage discharge circuitry for discharging the first body and first control voltages to respective body and control discharge values between the conditioning values, the voltage discharge circuitry comprising common discharge circuitry for electrically connecting the body and control nodes to each other at least as the first body and first control voltages start discharging such that they begin to discharge largely simultaneously.

64. A method as in claim 63 wherein the act of providing the voltage discharge circuitry further includes providing the voltage discharge circuitry to do at least one of (i) electrically connect the body node to a source of a body reference voltage approximately equal to the body discharge value and (ii) electrically connect the control node to a source of a control reference voltage approximately equal to the control discharge value.

* * * * *